(12) United States Patent
Hoshi

(10) Patent No.: US 11,121,221 B2
(45) Date of Patent: Sep. 14, 2021

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 61 days.

(21) Appl. No.: 16/807,115

(22) Filed: Mar. 2, 2020

(65) Prior Publication Data

US 2020/0328276 A1   Oct. 15, 2020

(30) Foreign Application Priority Data

Apr. 15, 2019 (JP) .............................. JP2019-077329

(51) Int. Cl.

| | |
|---|---|
| *H01L 29/10* | (2006.01) |
| *H01L 29/78* | (2006.01) |
| *H01L 29/06* | (2006.01) |
| *H01L 29/423* | (2006.01) |
| *H01L 29/16* | (2006.01) |

(52) U.S. Cl.
CPC ...... *H01L 29/1095* (2013.01); *H01L 29/0696* (2013.01); *H01L 29/1608* (2013.01); *H01L 29/4238* (2013.01); *H01L 29/7804* (2013.01)

(58) Field of Classification Search
None
See application file for complete search history.

(56) References Cited

U.S. PATENT DOCUMENTS

| | | | |
|---|---|---|---|
| 2017/0111037 A1* | 4/2017 | Shiigi | ................ H01L 29/1608 |
| 2019/0131443 A1 | 5/2019 | Hoshi et al. | |
| 2020/0328274 A1* | 10/2020 | Hoshi | ................ H01L 29/0696 |

FOREIGN PATENT DOCUMENTS

| | | |
|---|---|---|
| JP | 2017079324 A | 4/2017 |
| WO | 2018135147 A1 | 7/2018 |

* cited by examiner

*Primary Examiner* — Robert K Carpenter
(74) *Attorney, Agent, or Firm* — Rabin & Berdo, P.C.

(57) ABSTRACT

Unit cells of a current sensing portion are disposed in a sensing effective region of a main non-operating region. In a sensing non-operating region of the main non-operating region excluding the sensing effective region, an n$^-$-type region that surrounds a periphery of the sensing effective region is disposed in a surface region of the front surface of the semiconductor substrate. In the main non-operating region, a p-type base region disposed in a surface region of the front surface of the semiconductor substrate opposes the sensing effective region across the n$^-$-type region. The p-type base region is fixed at a source potential of the main semiconductor element 11. A field insulating film on the front surface of the semiconductor substrate is thicker at a portion that covers the n$^-$-type region that in other portions.

11 Claims, 15 Drawing Sheets

SEMICONDUCTOR DEVICE

CROSS REFERENCE TO RELATED APPLICATIONS

This application is based upon and claims the benefit of priority of the prior Japanese Patent Application No. 2019-077329, filed on Apr. 15, 2019, the entire contents of which are incorporated herein by reference.

BACKGROUND OF THE INVENTION

1. Field of the Invention

Embodiments of the invention relate to a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs) that have an insulated gate formed by a three-layered structure including a metal, an oxide film, and a semiconductor material. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

Further, MOSFETs structurally differ from IGBTs, have a built-in parasitic diode formed by a pn junction between a p-type base region and an n⁻-type drift region, and may use this parasitic diode as a free-wheeling diode for protecting the MOSFET. Therefore, instances in in which a MOSFET is used as an inverter device are gaining attention in terms of being economical since no external free-wheeling diode needs to be connected to the MOSFET.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable semiconductor material, has a wide bandgap of 3 eV, and can be used very stably as a semiconductor material even at high temperatures. Further, silicon carbide has a critical field strength that is at least ten times greater than the critical field strength of silicon and therefore, is expected to be a semiconductor material capable of sufficiently reducing ON resistance. Such characteristics of silicon carbide are shared by other wide bandgap semiconductor materials that have a bandgap wider than that of silicon (hereinafter, wide bandgap semiconductor material).

A structure of a conventional semiconductor device will described taking an n-channel MOSFET that uses silicon carbide (SiC) as a wide bandgap material as an example. FIG. 16 is a plan view of a layout when the conventional semiconductor device is viewed from a front side of a semiconductor substrate. In FIG. 16, a p-type base region 134b of a sensing effective region 112a and a p-type base region 134b' of a main non-operating region 101b are indicated by mutually differing hatching. FIGS. 17 and 18 are cross-sectional views of a structure of an active region in FIG. 16.

FIG. 17 depicts cross-sectional view of a structure of a main effective region 101a and a current sensing portion 112 (cross-sectional view along cutting line X101-X102-X103-X104-X105). FIG. 18 depicts a cross-sectional view of a structure of the main effective region 101a, the sensing effective region 112a and a temperature sensing portion 113 (cross-sectional view along cutting line X101-X102, cutting line X104-X105, and cutting line Y101-Y102).

A conventional semiconductor device 120 depicted in FIGS. 16 to 18 has in an active region 101 of a single semiconductor substrate 110 containing silicon carbide, a main semiconductor element 111 and one or more circuit portions for protecting/controlling the main semiconductor element 111. The main semiconductor element 111 is a vertical MOSFET and is configured by plural unit cells (functional units: not depicted) disposed adjacent to each other in an effective region (hereinafter, main effective region) 101a of the active region 101.

A source pad 121a of the main semiconductor element 111 is provided on a front surface of the semiconductor substrate 110, in the main effective region 101a. The circuit portions for protecting/controlling the main semiconductor element 111 are disposed in a region (hereinafter, main non-operating region) 101b of the active region 101, excluding the main effective region 101a. No unit cells of the main semiconductor element 111 are disposed in the main non-operating region 101b.

A surface area of the main non-operating region 101b is wide as compared to a surface area of a main non-operating region of a semiconductor device (semiconductor device in which only a gate pad is disposed in the main non-operating region) without the circuit portions for protecting/controlling the main semiconductor element 111. The circuit portions for protecting/controlling the main semiconductor element 111, for example, may be high-function portions such as the current sensing portion 112, the temperature sensing portion 113, an over-voltage protecting portion (not depicted), and an arithmetic circuit portion (not depicted).

The current sensing portion 112 is a vertical MOSFET that includes unit cells having a configuration similar to a configuration of the unit cells (functional units of the element) of the main semiconductor element 111, of a quantity fewer than a quantity of the unit cells in the main semiconductor element 111. The current sensing portion 112 is disposed separated from the main semiconductor element 111. The current sensing portion 112 operates under conditions identical to those of the main semiconductor element 111 and detects overcurrent (OC) flowing in the main semiconductor element 111.

The unit cells of the current sensing portion 112 are disposed in a region (hereinafter, sensing effective region) 112a of a portion of the current sensing portion 112 directly beneath an electrode pad (hereinafter, OC pad) 12. A region (hereinafter, sensing non-operating region) 112b directly beneath the OC pad 122 and excluding the sensing effective region 112a is a region in which no unit cells of the current sensing portion 112 are disposed and does not function as the current sensing portion 112.

In substantially the entire sensing non-operating region 112b, the p-type base region 134b' is provided in a surface region of the semiconductor substrate 110. A p$^+$-type region 162b' is provided between the p-type base region 134b' and an n$^-$-type drift region 132. The p-type base region 134b' and the p$^+$-type region 162b' of the sensing non-operating region 112b are separated from the sensing effective region 112a to a greater extent than is an n$^-$-type region 132b of a surface region of the semiconductor substrate 110.

The p-type base region 134b' of the sensing non-operating region 112b is connected to a p-type base region 134a of the main semiconductor element 111 and is fixed at a source potential of the main semiconductor element 111. Further, the p-type base region 134b' and the p$^+$-type region 162b' of the sensing non-operating region 112b extend throughout a region, excluding the sensing effective region 112a of the main non-operating region 101b and are disposed directly beneath electrode pads other than the source pad 121a.

The electrode pads other than the source pad 121a are provided on the front surface of the semiconductor substrate 110, in the main non-operating region 101b. In FIG. 16, the source pad 121a, a gate pad 121b, the OC pad 122, and electrode pads (an anode pad 123a and a cathode pad 123b) of the temperature sensing portion 113 are indicated by S, G, OC, A, and K, respectively. Reference numeral 102 is an edge termination region.

Reference characters 133a to 150a, 161a, 162a are parts of a trench-gate MOSFET configuring the main semiconductor element 111. Reference characters 133b to 150b, 161b, 162b are parts of a trench-gate MOSFET configuring the current sensing portion 112. Reference numerals 131, 132, 151 are respectively an n$^+$-type drain region, an n$^-$-type drift region, and a drain electrode common to the main semiconductor element 111 and the current sensing portion 112.

Further, as compared to a planar gate structure in which a channel is formed along the front surface of the semiconductor substrate accompanying increasing current, a trench gate structure in which a channel (inverse layer) is formed in a direction orthogonal to the front surface of the semiconductor substrate, along a side wall of a trench is advantageous in terms of cost. A reason for this is that a trench gate structure enables unit cell (configuration unit of an element) density per unit area to be increased and thereby, enables current density per unit area to be increased.

A rate of temperature rise relative to a volume occupied by the unit cells increases by an extent to which device current density is increased and therefore, to enhance discharge efficiency and stabilize reliability, a double-sided cooling structure is necessary. Further, with consideration of reliability, on a single semiconductor substrate with a vertical MOSFET that is a main semiconductor element, a high-function structure in which high-function portions such as the current sensing portion, the temperature sensing portion, and the over-voltage protecting portion have to be disposed as circuit portions for protecting/controlling a main semiconductor element.

As for examples of the conventional semiconductor device including the current sensing portion, a device has been proposed that is a semiconductor device in which high-function portions such as a current sensing portion, a temperature sensing portion, and an over-voltage protecting portion are provided on a single semiconductor substrate that has a main semiconductor element, and in the device, in a sensing non-operating region, a gate pad and a temperature sensing portion are provided on the front surface of the semiconductor substrate via a thick field insulating film (for example, refer to Japanese Laid-Open Patent Publication No. 2017-079324, International Publication No. WO 2018/135147)

SUMMARY OF THE INVENTION

According to an embodiment of the invention, a semiconductor device includes a semiconductor substrate containing a semiconductor having a bandgap wider than that of silicon, and having a first main surface and a second main surface opposite to the first main surface, the semiconductor substrate having first and second effective regions and a non-operating region that excludes the first and second effective regions; a first first-conductivity-type region of a first conductivity type, provided in the semiconductor substrate; a first second-conductivity-type region of a second conductivity type, provided between the first main surface of the semiconductor substrate and the first first-conductivity-type region; a first insulated gate field effect transistor, provided in the first effective region and having the first first-conductivity-type region as a drift region and the first second-conductivity-type region as a base region, the first insulated gate field effect transistor being constituted by a plurality of unit cells each having a cell structure; a first source pad of the first insulated gate field effect transistor, provided on the first main surface of the semiconductor substrate and electrically connected to the first second-conductivity-type region; a second second-conductivity-type region of the second conductivity type, provided between the first main surface of the semiconductor substrate and the first first-conductivity-type region, in a region different from the first second-conductivity-type region; a second insulated gate field effect transistor, provided in the second effective region, and having the first first-conductivity-type region as a drift region and the second second-conductivity-type region as a base region, the second insulated gate field effect transistor being constituted by a plurality of unit cells each having a cell structure same as the cell structure of each of the unit cells of the first insulated gate field effect transistor, a quantity of the plurality of unit cells of the second insulated gate field effect transistor being smaller than a quantity of the plurality of unit cells of the first insulated gate field effect transistor; a second source pad of the second insulated gate field effect transistor, provided on the first main surface of the semiconductor substrate, being separate from the first source pad and electrically connected to the second second-conductivity-type region; a field insulating film including a first part that covers the first main surface of the semiconductor substrate in the non-operating region and a second part that covers the first main surface of the semiconductor substrate in the first and second effective regions; a second first-conductivity-type region of the first conductivity type, surrounding a periphery of the second effective region and contacting the second effective region, the second first-conductivity-type region being provided in the non-operating region, between the first main surface of the semiconductor substrate and the first first-conductivity-type region; and a drain electrode that is common to the first insulated gate field effect transistor and the second insulated gate field effect transistor, and is electrically connected to the second main surface of the semiconductor substrate. The first part of the field insulating film has a thickness greater than a thickness of the second part of the field insulating film.

In the embodiment, a surface area of the second first-conductivity-type region is at least equal to a surface area of the second effective region.

In the embodiment, the second first-type region is provided in an entire region that is directly beneath the second source pad and excludes the second effective region.

In the embodiment, the semiconductor device further includes one or more electrode pads each facing the semiconductor substrate in a direction orthogonal to the first main surface of the semiconductor substrate, being provided on the first main surface of the semiconductor substrate in the non-operating region, and being separate from the first source pad and the second source pad. The second first-conductivity-type region extends from directly beneath the second source pad, to a region that faces at least one of the one or more electrode pads in the direction orthogonal to the first main surface of the semiconductor substrate.

In the embodiment, the one or more electrode pads includes a gate pad of the first insulated gate field effect transistor.

In the embodiment, the semiconductor device further includes a diode that detects a temperature of the first insulated gate field effect transistor. The one or more electrode pads includes an electrode pad of the diode.

In the embodiment, the semiconductor device further includes a diode that protects the first insulated gate field effect transistor from overvoltage. The one or more electrode pads includes an electrode pad of the diode.

In the embodiment, the second first-conductivity-type region is provided in an entire area of the non-operating region.

In the embodiment, the semiconductor device further includes a third second-conductivity-type region of the second conductivity type, provided in a region within the non-operating region excluding a region in which the second first-conductivity-type region is provided, the third second-conductivity-type region being provided between the first main surface of the semiconductor substrate and the first first-conductivity-type region, being electrically connected to the first second-conductivity-type region, and facing the second effective region in a direction parallel to the first main surface of the semiconductor substrate, via the second first-conductivity-type region.

In the embodiment, the thickness of the first part of the field insulating film is 1.5 times to 2.5 times the thickness of the second part of the field insulating film.

In the embodiment, the second insulated gate field effect transistor detects overcurrent of the first insulated gate field effect transistor.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
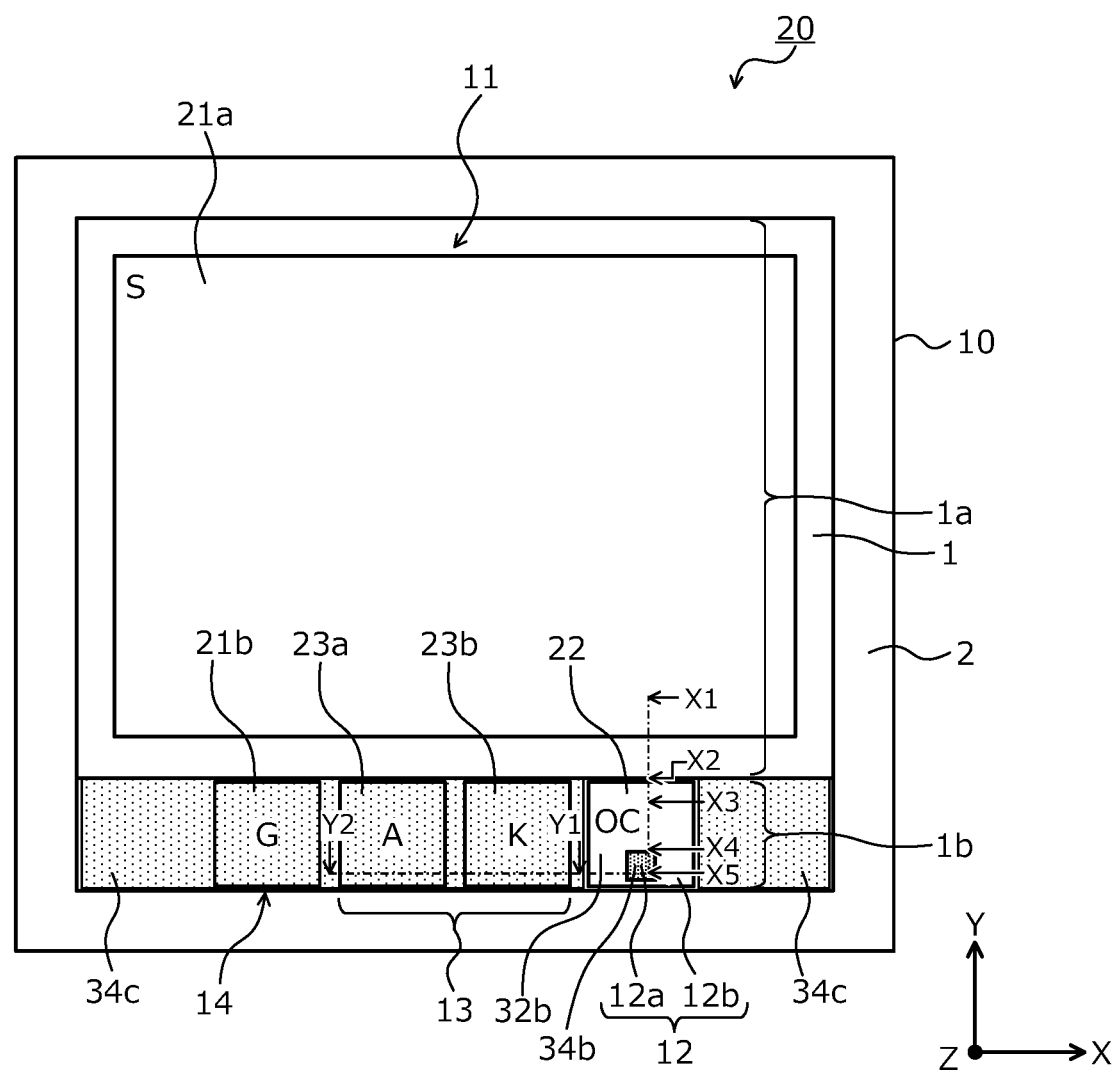
FIG. 1 is a plan view of a layout when a semiconductor device according to a first embodiment is viewed from a front side of a semiconductor substrate.

First, problems associated with the conventional techniques will be discussed. In the conventional semiconductor device 120, the p-type base region 134$b'$ of the main non-operating region 101$b$ is electrically connected to the source potential of the main semiconductor element 111, whereby a parasitic diode is formed by pn junctions between the p$^+$-type region 162$b'$ and the p-type base region 134$b'$ of the main non-operating region 101$b$ and the n$^-$-type drift region. The p-type base region 134$b'$ of the sensing non-operating region 112$b$ expands spanning substantially an entire region of the main non-operating region 101$b$, excluding the sensing effective region 112$a$ and therefore, as the surface area of the main non-operating region 101$b$ increases, the operating region of the parasitic diode formed by the p-type base region 134$b'$ of the main non-operating region 101$b$ increases.

When the conventional semiconductor device 120 is equipped having a switching configuration in a circuit device, the parasitic diode formed by the p-type base region 134$b'$ of the main non-operating region 101$b$ turns OFF together with a parasitic diode formed by a pn junction between the p-type base region 134a of the main semiconductor element 111 and the n⁻-type drift region 132, when the main semiconductor element 111 switches from OFF to ON. Here, positive holes (holes) generated by the main non-operating region 101b flow into the sensing effective region 112a and hole current (reverse recovery current) concentrates in the current sensing portion 112. Therefore, as the surface area of the main non-operating region 101b increases, large current flows to and concentrates in the current sensing portion 112, whereby the current sensing portion 112 become susceptible to destruction.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A semiconductor device according to a first embodiment is configured using a semiconductor (wide bandgap material) having a bandgap wider than that of silicon (Si) as a semiconductor material. A structure of the semiconductor device according to the first embodiment will be described taking, as an example, a case in which, for example, silicon carbide (SiC) is used as a wide bandgap material. FIG. 1 is a plan view of a layout when the semiconductor device according to the first embodiment is viewed from a front side of a semiconductor substrate. In FIG. 1, a p-type base region (second second-conductivity-type region) 34b of a sensing effective region (second effective region) 12a and a p-type base region (third second-conductivity-type region) 34c of a main non-operating region 1b are depicted in mutually different hatching (Similarly in FIGS. 11, 12, and 14).

A semiconductor device 20 according to the first embodiment and depicted in FIG. 1 has a main semiconductor element (first insulated gate field effect transistor) 11 and one or more circuit portions for protecting/controlling the main semiconductor element 11, in an active region 1 of a single semiconductor substrate (semiconductor chip) 10. The main semiconductor element 11 is a vertical MOSFET in which in an ON state, drift current flows in a depth direction Z of a semiconductor substrate 10. The main semiconductor element 11 is configured by plural unit cells (functional units of the element) connected in parallel by a source pad (first source pad) 21a.

The unit cells of the main semiconductor element 11 are disposed adjacent to each other in a direction parallel to a front surface of the semiconductor substrate 10. The main semiconductor element 11 performs a main operation of the semiconductor device 20 according to the first embodiment. The main semiconductor element 11 is disposed in an effective region (main effective region: first effective region) 1a of the active region 1. The main effective region 1a is a region through which a main current of the main semiconductor element 11 flows when the main semiconductor element 11 is ON. The main effective region 1a, for example, has a substantially rectangular planar shape and occupies most of the surface area of the active region 1.

The circuit portions for protecting/controlling the main semiconductor element 11, for example, are high-function portions such as a current sensing portion (second insulated gate field effect transistor) 12, a temperature sensing portion 13, an over-voltage protecting portion (not depicted), and an arithmetic circuit portion (not depicted), and are disposed in the main non-operating region 1b of the active region 1. The main non-operating region 1b is a region in which no unit cells of the main semiconductor element 11 are disposed and does not function as the main semiconductor element 11. The main non-operating region 1b, for example, has a substantially rectangular planar shape, and is disposed between the main effective region 1a and an edge termination region 2.

The edge termination region 2 is a region between the active region 1 and an edge of the semiconductor substrate 10, surrounds a periphery of the active region 1, mitigates electric field on the front side of the semiconductor substrate 10, and sustains a breakdown voltage. In the edge termination region 2, for example, a voltage withstanding structure (not depicted) such as a field limiting ring (FLR), a junction termination extension (JTE) structure, etc. is disposed. The breakdown voltage is a voltage limit at which no errant operation or destruction of the element occurs.

The source pad (electrode pad) 21a of the main semiconductor element 11 is disposed on the front surface of the semiconductor substrate 10, in the main effective region 1a. The main semiconductor element 11 has a greater current capacity as compared to other circuit portions. Therefore, the source pad 21a of the main semiconductor element 11 has a planar shape substantially like that of the main effective region 1a and covers substantially the main effective region 1a entirely. The source pad of the main semiconductor element 11 is disposed separated from electrode pads other than the source pad 21a.

The electrode pads other than the source pad 21a are disposed separated from the edge termination region 2 and separated from each other, on the front surface of the semiconductor substrate 10 in the main non-operating region 1b. The electrode pads other than the source pad 21a are the gate pad 21b of the main semiconductor element 11, an electrode pad (hereinafter, OC pad (second source pad)) 22 of the current sensing portion 12, electrode pads (hereinafter, anode pad and cathode pad) 23a, 23b of the temperature sensing portion 13, an electrode pad (hereinafter, OV pad (not depicted)) of the over-voltage protecting portion, and an electrode pad (not depicted) of the arithmetic circuit portion.

The electrode pads other than the source pad 21a, for example, have a substantially rectangular planar shape and a surface area necessary for bonding terminal pins 48b to 48d described hereinafter, wiring, etc. FIG. 1 depicts a case in which the electrode pads other than the source pad 21a are disposed in a row along a border between the main non-operating region 1b and the edge termination region 2 (similarly in FIGS. 11 to 14). Further, in FIG. 1, the source pad 21a, the gate pad 21b, the OC pad 22, the anode pad 23a, and the cathode pad 23b are depicted in rectangular shapes indicated by S, G, OC, A, and K, respectively (similarly in FIGS. 11 to 14).

The current sensing portion 12 operates under conditions similar to those of the main semiconductor element 11 and has a function of detecting overcurrent (OC) flowing in the main semiconductor element 11. The current sensing portion 12 is disposed separated from the main semiconductor element 11. The current sensing portion 12 is a vertical MOSFET that includes unit cells having a configuration similar to those of the main semiconductor element 11, of a quantity (for example, about 10) lower than a quantity (for example, about 10,000) of the unit cells of the main semiconductor element 11, and that has a surface area smaller than a surface area of the main semiconductor element 11.

The unit cells of the current sensing portion 12 are disposed in a region (hereinafter, sensing effective region) 12a of a portion directly beneath the OC pad 22. The sensing effective region 12a, for example, has a rectangular planar shape. Unit cells of the current sensing portion 12 are disposed adjacent to each other along a direction parallel to the front surface of the semiconductor substrate 10. The direction along which the unit cells of the current sensing portion 12 are adjacent to each other, for example, is a same direction along which the unit cells of the main semiconductor element 11 are adjacent to each other. The unit cells of the current sensing portion 12 are connected in parallel to each other by the OC pad 22.

Further, directly beneath the OC pad 22, a region excluding the sensing effective region 12a is a sensing non-operating region 12b that does not function as the current sensing portion 12. In the sensing non-operating region 12b, no unit cells of the current sensing portion 12 are disposed. In the sensing non-operating region 12b, an $n^-$-type region (second first-conductivity-type region) 32b is provided in a surface region of the front surface of the semiconductor substrate 10. In a portion of the sensing non-operating region 12b where the $n^-$-type region 32b is provided, n-type regions (an $n^+$-type starting substrate 31 described hereinafter, an $n^-$-type drift region (first first-conductivity-type region) 32 described hereinafter, and the $n^-$-type region 32b, refer to FIG. 2) alone are disposed from a back surface of the semiconductor substrate 10 across to the front surface thereof and no p-type region is disposed.

The $n^-$-type region 32b surrounds a periphery of the sensing effective region 12a in a substantially rectangular shape. The $n^-$-type region 32b has a surface area that is at least equal to a surface area of the sensing effective region 12a. Provided the surface area of the $n^-$-type region 32b is at least equal to the surface area of the sensing effective region 12a, the p-type base region 34c described hereinafter may extend directly beneath the OC pad 22 from a region of the main non-operating region 1b excluding that directly beneath the OC pad 22. FIG. 1 depicts a case in which the p-type base region 34c is not present directly beneath the OC pad 22 and the $n^-$-type region 32b is provided in the entire sensing non-operating region 12b (similarly in FIGS. 11 and 12).

Figure 16:
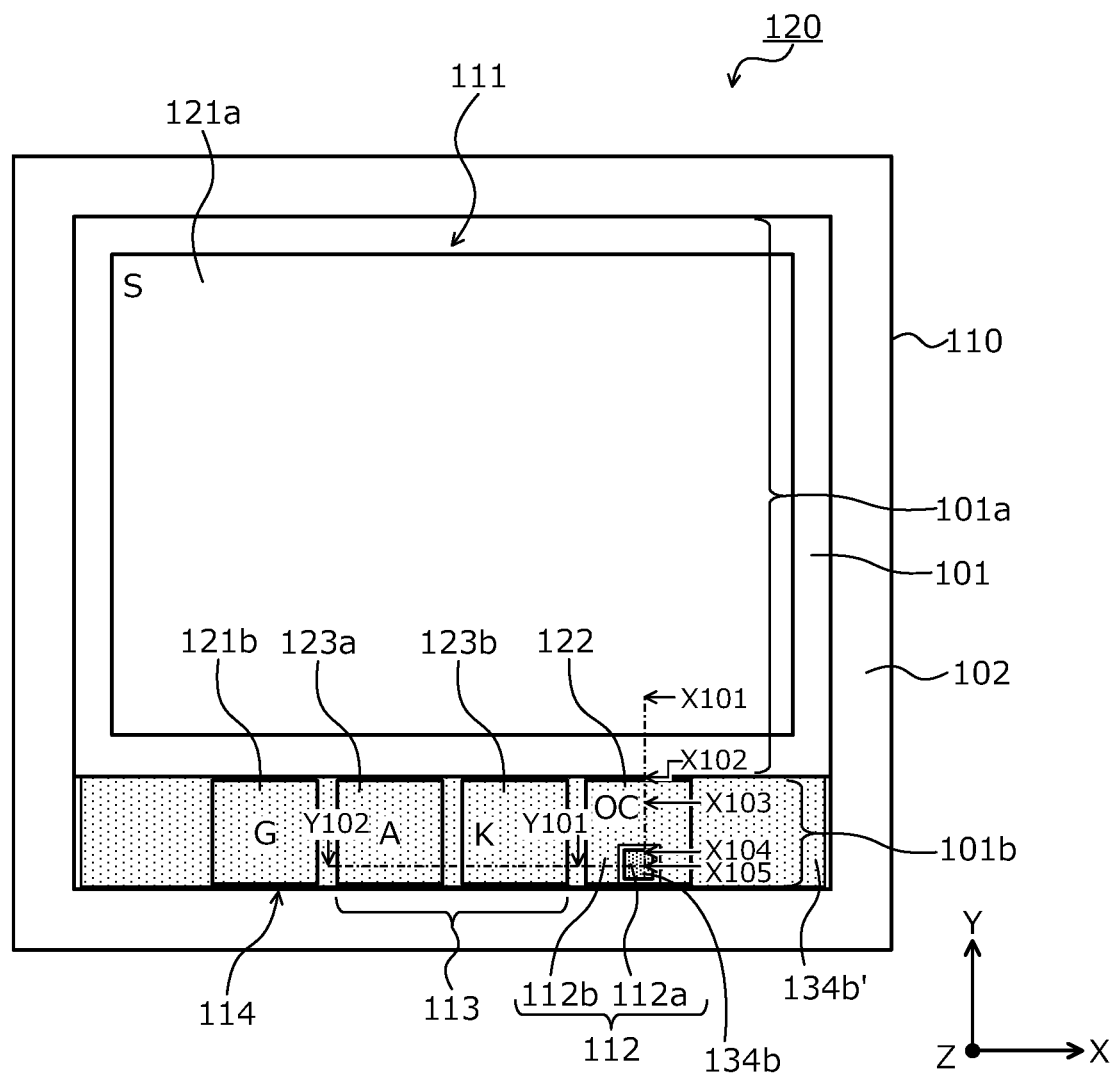
FIG. 16 is a plan view of a layout when a conventional semiconductor device is viewed from a front side of a semiconductor substrate.

For example, in the conventional structure (refer to FIGS. 16 and 17), the p-type base region 134b' provided in a surface region of the front surface of the semiconductor substrate 110 in the sensing non-operating region 112b has a function of making electric field at the front surface of the semiconductor substrate 110 in the sensing non-operating region 112b uniform and a function of enhancing breakdown voltage. Accordingly, when the $n^-$-type region 32b is provided in the sensing non-operating region 12b like in the first embodiment (a region is present in which no p-type base region is provided), as compared to the conventional structure, while the breakdown voltage decreases slightly at a portion of the $n^-$-type region 32b, usually, a predetermined margin is expected and the breakdown voltage is designed to be higher than an operating voltage, thus, no failure occurs.

In particular, for example, usually, the breakdown voltage is designed to be about 1700V when a product operating voltage is 1200V. Breakdown voltage decreases that occur due to provision of the $n^-$-type region 32b in the sensing non-operating region 12b are about 5% of the breakdown voltage in a case where the p-type base region 134b' is provided in substantially the entire sensing non-operating region 112b like in the conventional structure. When the breakdown voltage design is that usually performed where a breakdown voltage of about 1700V is set, a maximum breakdown voltage decrease is about 100V and therefore, the breakdown voltage is about 1600V and a sufficient breakdown voltage margin may be expected for an operating voltage of 1200V. Therefore, no failure occurs with breakdown voltage decreases of a magnitude of those occurring due to the provision of the $n^-$-type region 32b in the sensing non-operating region 12b.

In substantially an entire region of the main non-operating region 1b excluding a region (region excluding the current sensing portion 12) directly beneath the OC pad 22, the p-type base region 34c is provided in a surface region of the front surface of the semiconductor substrate 10. The p-type base region 34c of the main non-operating region 1b is connected to a p-type base region (first second-conductivity-type region) 34a of the main semiconductor element 11 and fixed at a source potential of the main semiconductor element 11. The p-type base region 34c of the main non-operating region 1b and a second $p^+$-type region 62c described hereinafter are separated from the p-type base region 34b and a second $p^+$-type region 62b of the sensing effective region 12a, by the $n^-$-type region 32b.

Further, the p-type base region 34c of the main non-operating region 1b and the second $p^+$-type region 62c are disposed separated from the p-type region for element isolation (not depicted). As a result, positive holes (holes) that flow from the back side of the semiconductor substrate 10 to the p-type region for element isolation may be suppressed from concentrating in the current sensing portion 12. The p-type region for element isolation is a floating p-type region that is provided in the edge termination region 2, in a substantially rectangular shape surrounding a periphery of the active region 1 and that forms a pn junction with the $n^-$-type drift region 32 and by the pn junction, forms a parasitic diode that electrically separates the active region 1 and the edge termination region 2.

The temperature sensing portion 13 has a function of detecting a temperature of the main semiconductor element 11 by using diode temperature characteristics. The temperature sensing portion 13 is disposed directly beneath the anode pad 23a and the cathode pad 23b. The temperature sensing portion 13, for example, may be configured by a polysilicon (poly-Si) layer provided on a field insulating film (in the first embodiment, a field insulating film part 80c) on the front surface of the semiconductor substrate 10, or may be formed by a pn junction between a p-type region and an n-type region formed in the semiconductor substrate 10.

The over-voltage protecting portion (not depicted), for example, is a diode that protects the main semiconductor element 11 from overvoltage (OV) such as surges. The current sensing portion 12, the temperature sensing portion 13, and the over-voltage protecting portion are controlled by the arithmetic circuit portion. The main semiconductor element 11 is controlled based on output signals from the current sensing portion 12, the temperature sensing portion 13, and the over-voltage protecting portion. The arithmetic circuit portion is configured by plural semiconductor elements such as complementary MOS (CMOS) circuits.

Figure 2:
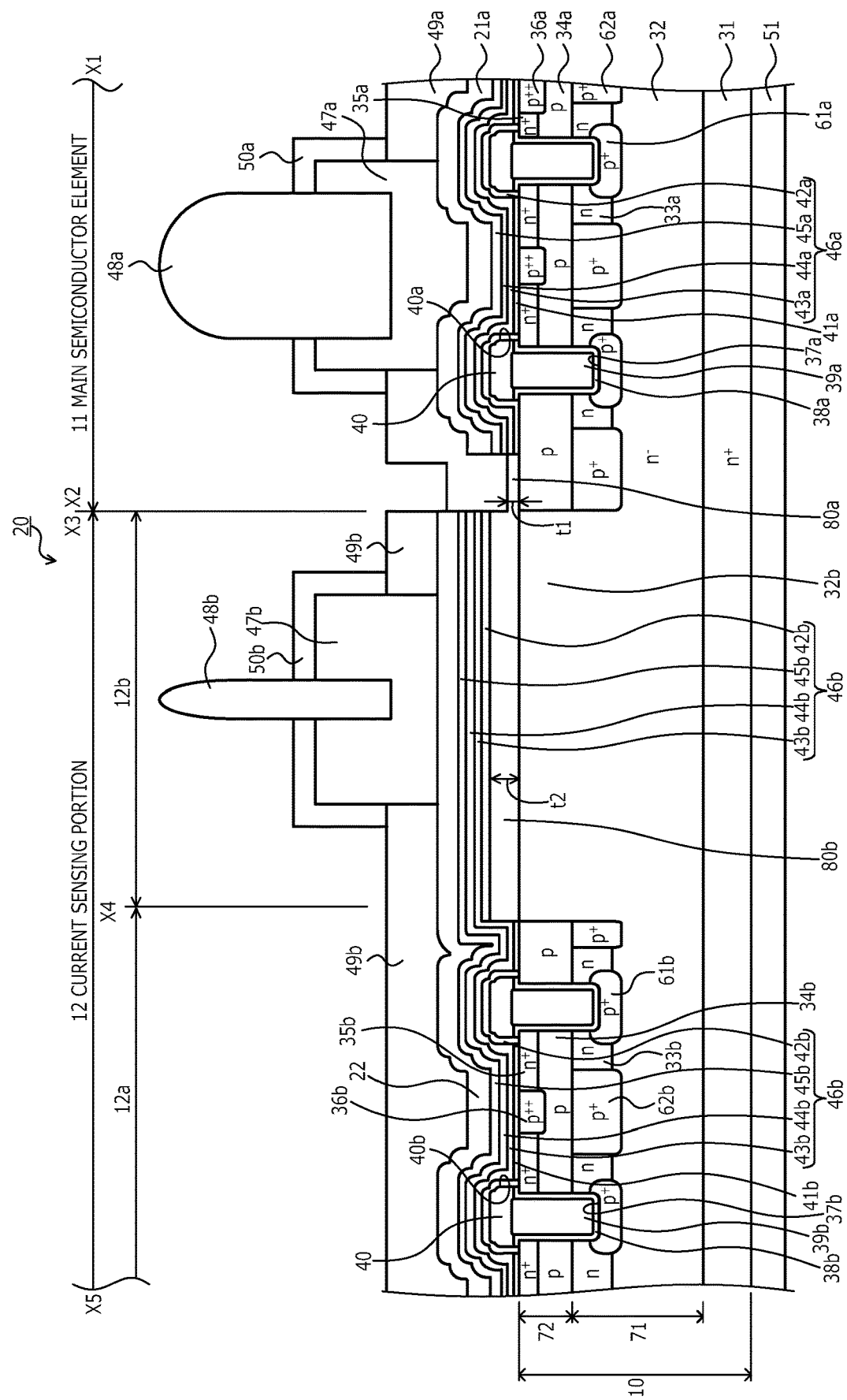
FIG. 2 is a cross-sectional view of a structure of an active region in FIG. 1.
Figure 3:
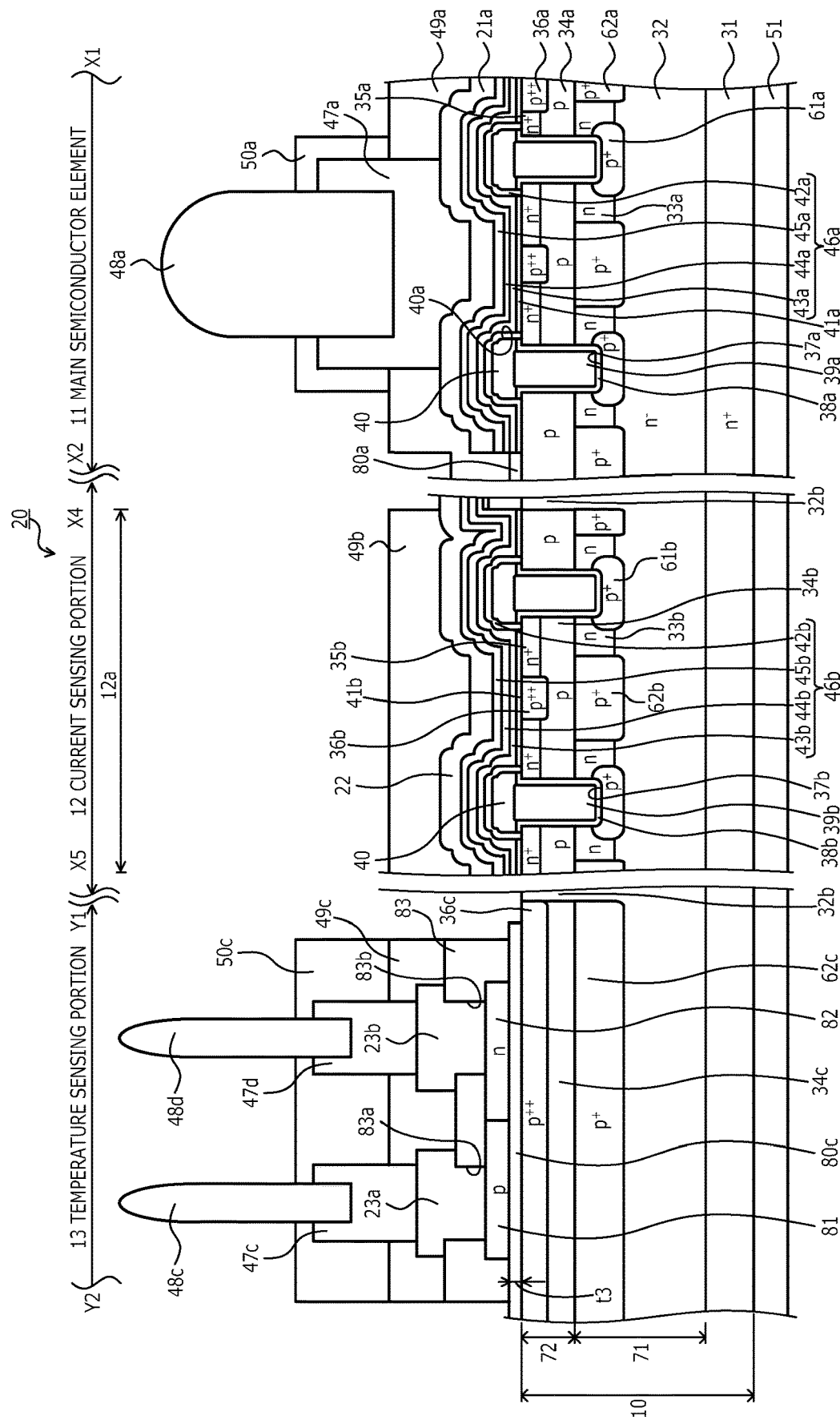
FIG. 3 is a cross-sectional view of the structure of the active region in FIG. 1.

A cross-section of a structure of the active region 1 of the semiconductor device 20 according to the first embodiment will be described. FIGS. 2 and 3 are cross-sectional views of the structure of the active region in FIG. 1. FIG. 2 depicts a cross-section (along cutting line X1-X2-X3-X4-X5) of the structure of the main effective region 1a and the current sensing portion 12. FIG. 3 depicts a cross-section (along cutting line X1-X2, cutting line X4-X5, and cutting line Y1-Y2) of the structure of the main effective region 1a, the sensing effective region 12a, and the temperature sensing portion 13.

In FIGS. 2 and 3, while only a portion of the unit cells of the main effective region 1a and the sensing effective region 12a is depicted, unit cells of the main effective region 1a and the sensing effective region 12a all have a similar structure. Further, in FIGS. 2 and 3, while a cross-section of the structure directly beneath the gate pad 21b is not depicted, a cross-section of the structure directly beneath the gate pad 21b is similar to that directly beneath the anode pad 23a and the cathode pad 23b. In FIG. 3, the sensing non-operating region 12b between the main effective region 1a and the sensing effective region 12a is not depicted.

The main semiconductor element 11 is a vertical MOSFET that includes a MOS gate (insulated gate formed by a 3-layer structure including a metal, an oxide film, and a semiconductor) on the front side of the semiconductor substrate 10, in the main effective region 1a. Here, while a case in which the main semiconductor element 11 and the circuit portions that protect and control the main semiconductor element 11 have wiring structures of a similar configuration that uses pin-shaped wiring members (terminal pins 48a to 48d described hereinafter) is described as an example, instead of the pin-shaped wiring members, each may have a wiring structure that uses wires.

The semiconductor substrate 10 is an epitaxial substrate in which silicon carbide layers 71, 72 that become the n⁻-type drift region 32 and the p-type base region 34a are sequentially formed by epitaxial growth on an n⁺-type starting substrate 31 containing silicon carbide. The main semiconductor element 11 has general MOS gates configured by the p-type base region 34a, n⁺-type source regions 35a, p⁺⁺-type contact regions 36a, trenches 37a, a gate insulating film 38a, and gate electrodes 39a provided on the front side of the semiconductor substrate 10.

The trenches 37a penetrate through the p-type silicon carbide layer 72 in the depth direction Z from the front surface of the semiconductor substrate 10 (surface of p-type silicon carbide layer 72) and reach the n⁻-type silicon carbide layer 71. The trenches 37a, for example, may be disposed in a striped shape extending along a direction parallel to the front surface of the semiconductor substrate 10 or may be disposed in a matrix-like layout when viewed from the front side of the semiconductor substrate 10. FIGS. 2 and 3 depict the trenches 37a having a striped shape extending in a first direction X (refer to FIG. 1) along which the electrode pads 21b, 23a, 23b, 22 are arranged. Reference character Y is a direction that is parallel to the front surface of the semiconductor chip and orthogonal to the first direction.

In the trenches 37a, the gate electrodes 39a are provided via the gate insulating film 38a. The p-type base region 34a, the n⁺-type source region 35a, and the p⁺⁺-type contact region 36a are selectively provided in a surface region of the front surface of the semiconductor substrate 10 between (mesa region) two of the trenches 37a that are adjacent to each other. The n⁺-type source region 35a and the p⁺⁺-type contact region 36a are provided between the front surface of the semiconductor substrate 10 and the p-type base region 34a.

The n⁺-type source region 35a is provided closer to the trenches 37a than is the p⁺⁺-type contact region 36a. The p⁺⁺-type contact region 36a may be omitted. When the p⁺⁺-type contact region 36a is not provided, at a part separated further from the trenches 37a than is the n⁺-type source region 35a, the p-type base region 34a reaches the front surface of the semiconductor substrate 10 and is exposed at the front surface of the semiconductor substrate 10.

In the semiconductor substrate 10, at a position closer to an n⁺-type drain region (the n⁺-type starting substrate 31) than is the p-type base region 34a, the n⁻-type drift region 32 is provided in contact with the p-type base region 34a. In contact with these regions, an n-type current spreading region 33a may be provided between the p-type base region 34a and the n⁻-type drift region 32. The n-type current spreading region 33a is a so-called current spreading layer (CSL) that reduces carrier spreading resistance.

Further, in the semiconductor substrate 10, first and second p⁺-type regions 61a, 62a may be provided at positions closer to the n⁺-type drain region than is the p-type base region 34a. The first p⁺-type regions 61a are provided separated from the p-type base region 34a and oppose bottoms of the trenches 37a in the depth direction Z. The second p⁺-type regions 62a are provided in the mesa regions, are separated from the first p⁺-type regions 61a and the trenches 37a, and reach the p-type base region 34a. The first and the second p⁺-type regions 61a, 62a have a function of mitigating electric field applied to the bottoms of the trenches 37a.

An interlayer insulating film 40 is provided on the entire front surface of the semiconductor substrate 10 and covers the gate electrodes 39a. All of the gate electrodes 39a of the main semiconductor element 11 are electrically connected to the gate pad 21b (refer to FIG. 1) via a gate runner (not depicted), at a portion not depicted. The gate runner is a gate polysilicon layer that is provided on the front surface of the semiconductor substrate in the edge termination region 2 via a field insulating film and that surrounds a periphery of the active region 1 in a substantially rectangular shape.

In first contact holes 40a that penetrate through the interlayer insulating film 40 in the depth direction Z and reach the semiconductor substrate 10, the n⁺-type source regions 35a and the p⁺⁺-type contact regions 36a of the main semiconductor element 11 are exposed. In the first contact holes 40a, on the front surface of the semiconductor substrate 10, nickel silicide (NiSi, Ni₂Si, or thermally stable NiSi₂, hereinafter, collectively "NiSi") films 41a are provided.

The NiSi films 41a, in the first contact holes 40a, are in ohmic contact with the semiconductor substrate 10 and are electrically connected to the n⁺-type source regions 35a and the p⁺⁺-type contact regions 36a. In a case where the p⁺⁺-type contact regions 36a are not provided, instead of the p⁺⁺-type contact regions 36a, the p-type base region 34a is exposed by the first contact holes 40a and is electrically connected to the NiSi films 41a.

In the main effective region 1a, on surfaces of the interlayer insulating film 40 and the NiSi films 41a overall, a barrier metal 46a is provided. The barrier metal 46a has a function of preventing interaction between metal films of the barrier metal 46a or between regions opposing and sandwiching the barrier metal 46a. The barrier metal 46a, for example, may have a stacked structure in which a first titanium nitride (TiN) film 42a, a first titanium (Ti) film 43a, a second TiN film 44a, and a second Ti film 45a are sequentially stacked.

The first TiN film 42a is provided only on a surface of the interlayer insulating film 40, covering the surface of the interlayer insulating film 40 overall. The first Ti film 43a is provided on surfaces of the first TiN film 42a and the NiSi films 41a. The second TiN film 44a is provided on a surface of the first Ti film 43a. The second Ti film 45a is provided on a surface of the second TiN film 44a. The barrier metal 46a, for example, is not provided in the temperature sensing portion 13.

The source pad 21a is embedded in the first contact holes 40a and provided on the entire surface of the second Ti film 45a. The source pad 21a is electrically connected to the $n^+$-type source regions 35a and the p-type base region 34a via the barrier metal 46a and the NiSi films 41a and functions as a source electrode of the main semiconductor element 11. The source pad 21a, for example, is an aluminum (Al) film or an aluminum alloy film having a thickness of about 5 μm.

In particular, when the source pad 21a is an aluminum alloy film, the source pad 21a, for example, may be an aluminum-silicon (Al—Si) film that contains at most about 5% in total, may be an aluminum-silicon-copper (Al—Si—Cu) film that contains at most about 5% silicon and at most about 5% copper (Cu) in total, or may be an aluminum-copper (Al—Cu) film that contains at most about 5% copper in total.

First ends of the terminal pins 48a are bonded on the source pad 21a, via plating films 47a and solder layers (not depicted). Second ends of the terminal pins 48a are bonded to a metal bar (not depicted) disposed so as to oppose the front surface of the semiconductor substrate 10. Further, the second ends of the terminal pins 48a are exposed outside a case (not depicted) in which the semiconductor substrate 10 is mounted and are electrically connected to an external device (not depicted). The terminal pins 48a are wiring members having a round bar-like (cylindrical) shape of a predetermined diameter.

The terminal pins 48a are soldered to the plating films 47a in a substantially upright state with respect to the front surface of the semiconductor substrate 10. The terminal pins 48a are external connection terminals that lead out electric potential of the source pad 21a to an external destination and are connected to an external ground potential (minimum electric potential). A portion of the surface of the source pad 21a other than portions having the plating films 47a is covered by a first protective film 49a, and borders between the plating films 47a and the first protective film 49a are covered by second protective films 50a. The first and the second protective films 49a, 50a, for example, are polyimide films.

A drain electrode 51 is in ohmic contact with an entire back surface (back surface of the $n^+$-type starting substrate 31) of the semiconductor substrate 10. On the drain electrode 51, for example, a drain pad (electrode pad: not depicted) is provided having a stacked structure in which a Ti film, a nickel (Ni) film, and a gold (Au) film are sequentially stacked. The drain pad is soldered to a metal base plate (not depicted) and via the metal base plate, at least a portion thereof is in contact with a base part of a cooling fin (not depicted).

In this manner, the terminal pins 48a are bonded to the front surface of the semiconductor substrate 10 and the back surface is bonded to the metal base plate, whereby the semiconductor device 20 according to the first embodiment has a double-sided cooling structure in which a cooling structure is provided on both sides of the semiconductor substrate 10. In other words, heat generated by the semiconductor substrate 10 is radiated from a fin portion of the cooling fin in contact with the back surface of the semiconductor substrate 10 via the metal base plate and is radiated from the metal bar to which the terminal pins 48a of the front surface of the semiconductor substrate 10 are bonded.

The current sensing portion 12 includes the p-type base region 34b, $n^+$-type source regions 35b, $p^{++}$-type contact regions 36b, trenches 37b, a gate insulating film 38b, gate electrodes 39b, and the interlayer insulating film 40 respectively having configurations similar to configurations of corresponding parts of the main semiconductor element 11. Parts of the MOS gates of the current sensing portion 12 are provided in the sensing effective region 12a of the main non-operating region 1b. The p-type base region 34b of the current sensing portion 12 is separated from the p-type base region 34a of the main semiconductor element 11 by the $n^-$-type region 32b of the main non-operating region 1b.

In the current sensing portion 12 as well, similarly to the main semiconductor element 11, the $p^{++}$-type contact regions 36b may be omitted. The current sensing portion 12, similarly to the main semiconductor element 11, may have an n-type current spreading region 33b and first and second $p^+$-type regions 61b, 62b. The gate electrodes 39b of the current sensing portion 12 are electrically connected to the gate pad 21b (refer to FIG. 1) via the gate runner (not depicted). The gate electrodes 39b of the current sensing portion 12 are covered by the interlayer insulating film 40.

In the sensing effective region 12a, second contact holes 40b that penetrate through the interlayer insulating film 40 in the depth direction Z and reach the semiconductor substrate 10 are provided. In the second contact holes 40b, the $n^+$-type source regions 35b and the $p^{++}$-type contact regions 36b of the current sensing portion 12 are exposed. In the second contact holes 40b, similarly to the main semiconductor element 11, NiSi films 41b that are electrically connected to the $n^+$-type source regions 35b and the $p^{++}$-type contact regions 36b are provided.

In a case where the $p^{++}$-type contact regions 36b are not provided, instead of the $p^{++}$-type contact regions 36b, the p-type base region 34b is exposed by the second contact holes 40b and is electrically connected to the NiSi films 41b. In the sensing effective region 12a, similarly to the main semiconductor element 11, a barrier metal 46b is provided on an entire surface of the interlayer insulating film 40 and entire surfaces of the NiSi films 41b. Reference characters 42b to 45b are a first TiN film, a first Ti film, a second TiN film, and a second Ti film configuring the barrier metal 46b.

The OC pad 22 is provided on the entire surface of the barrier metal 46b so as to be embedded in the second contact holes 40b. The OC pad 22 is electrically connected to the $n^+$-type source regions 35b and the p-type base region 34b of the current sensing portion 12, via the barrier metal 46b and the NiSi films 41b. The OC pad 22 functions as a source electrode of the current sensing portion 12. The OC pad 22, for example, is formed by a material similar to that of the source pad 21a.

In the sensing non-operating region 12b of the main non-operating region 1b, as described above, the $n^-$-type region 32b is selectively provided in a surface region of the front surface of the semiconductor substrate 10. In the sensing non-operating region 12b, at a portion thereof where the $n^-$-type region 32b is provided, the $n^+$-type starting substrate 31, the $n^-$-type drift region 32 (the $n^-$-type silicon carbide layer 71), and the $n^-$-type region 32b are sequentially stacked from the back surface to the front surface of the semiconductor substrate 10. The $n^-$-type region 32b, for example, is a diffusion region that penetrates the p-type silicon carbide layer 72 in the depth direction Z and reaches the $n^-$-type silicon carbide layer 71 and is provided in a surface region of the front surface of the semiconductor substrate 10.

In substantially an entire region of the main non-operating region 1b excluding a portion directly beneath the OC pad 22, as described above, the p-type base region 34c is provided in a surface region of the front surface of the semiconductor substrate 10. The p-type base region 34c, similarly to the p-type base region 34b of the current sensing portion 12, is configured by the p-type silicon carbide layer 72. Between the p-type base region 34c and the front surface of the semiconductor substrate 10, a $p^{++}$-type contact region 36c may be provided. The second $p^+$-type region 62c may be provided between the p-type base region 34c and the $n^-$-type drift region 32, in contact with these regions 34c, 32.

In a region of the main non-operating region 1b excluding the sensing effective region 12a and in the edge termination region 2, on the front surface of the semiconductor substrate 10 overall, a field insulating film (80a, 80b, 80c) is provided. The field insulating film is thicker at a part (first part) 80b thereof covering the $n^-$-type region 32b than at remaining parts (second part) 80a, 80c. In FIGS. 2 and 3, a part of the field insulating film near a border between the main effective region 1a and the main non-operating region 1b is indicated by reference character 80a. Of the field insulating film in the main non-operating region 1b, a thick part having a thickness t2 is indicated by reference character 80b while a thin part having a thickness t3 is indicated by reference character 80c.

The thickness t2 of the field insulating film part 80b is greater than the respective thicknesses t1, t3 of the field insulating film parts 80a, 80c. The thickness t2 of the field insulating film part 80b directly beneath the field insulating film part 80b is set to a thickness whereby dielectric breakdown does not occur due to electric field applied to the front side of the semiconductor substrate 10. In particular, the thickness t2 of the field insulating film part 80b, for example, is about 1.5 times to 2.5 times the thicknesses t1, t3 of the field insulating film parts 80a, 80c and is at least about 1 μm.

Alternatively, the thickness t2 of the field insulating film part 80b may be about 2 times the thicknesses t1, t3 of the field insulating film parts 80a, 80c. A reason for this is that when the thickness t2 of the field insulating film part 80b is too thick, a step formed at a surface of the field insulating film by the field insulating film part 80b and the field insulating film parts 80a, 80c increases, adversely affecting the flatness of the chip surface.

Figure 17:
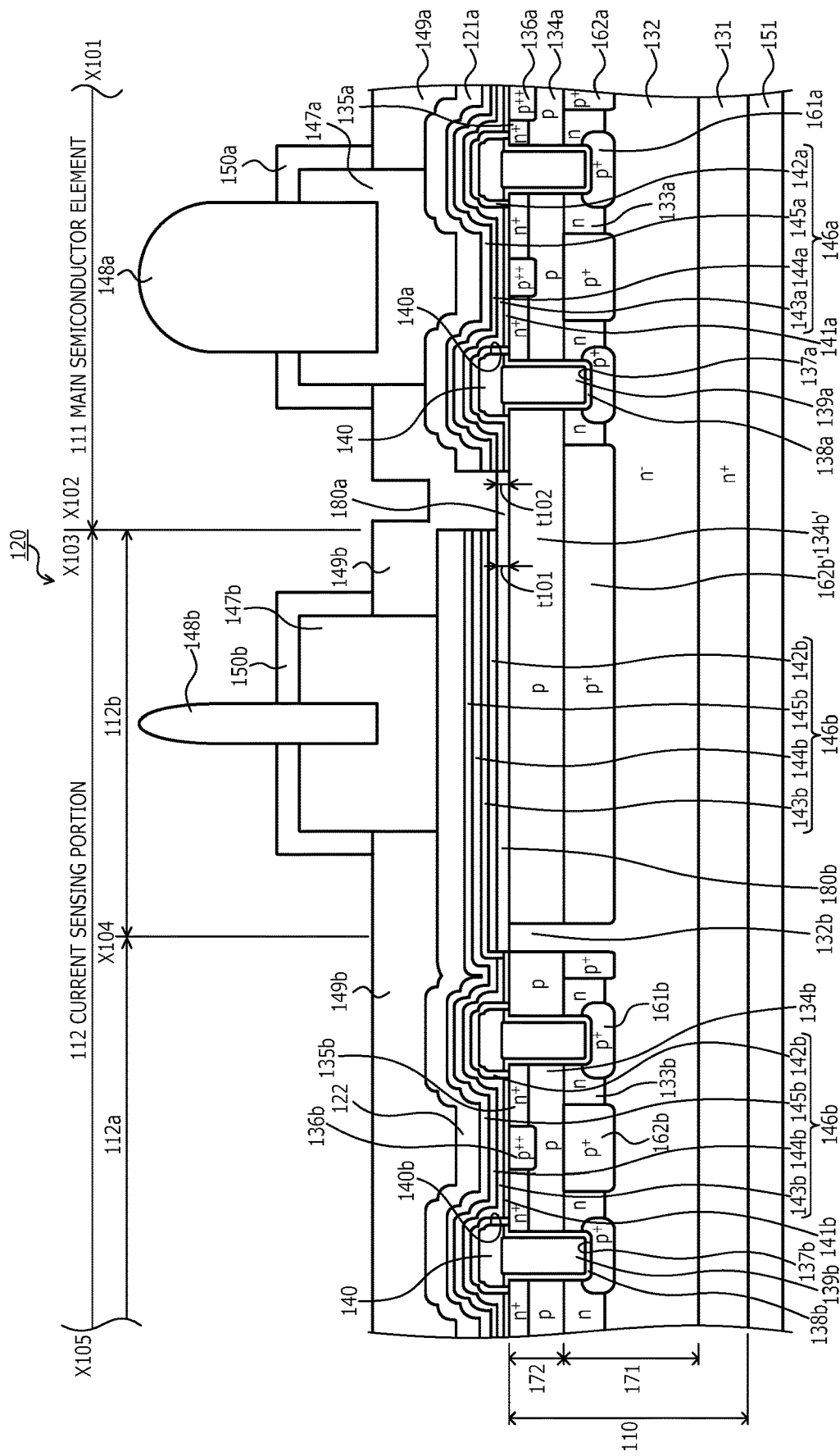
FIG. 17 is a cross-sectional view of a structure of an active region in FIG. 16.
Figure 18:
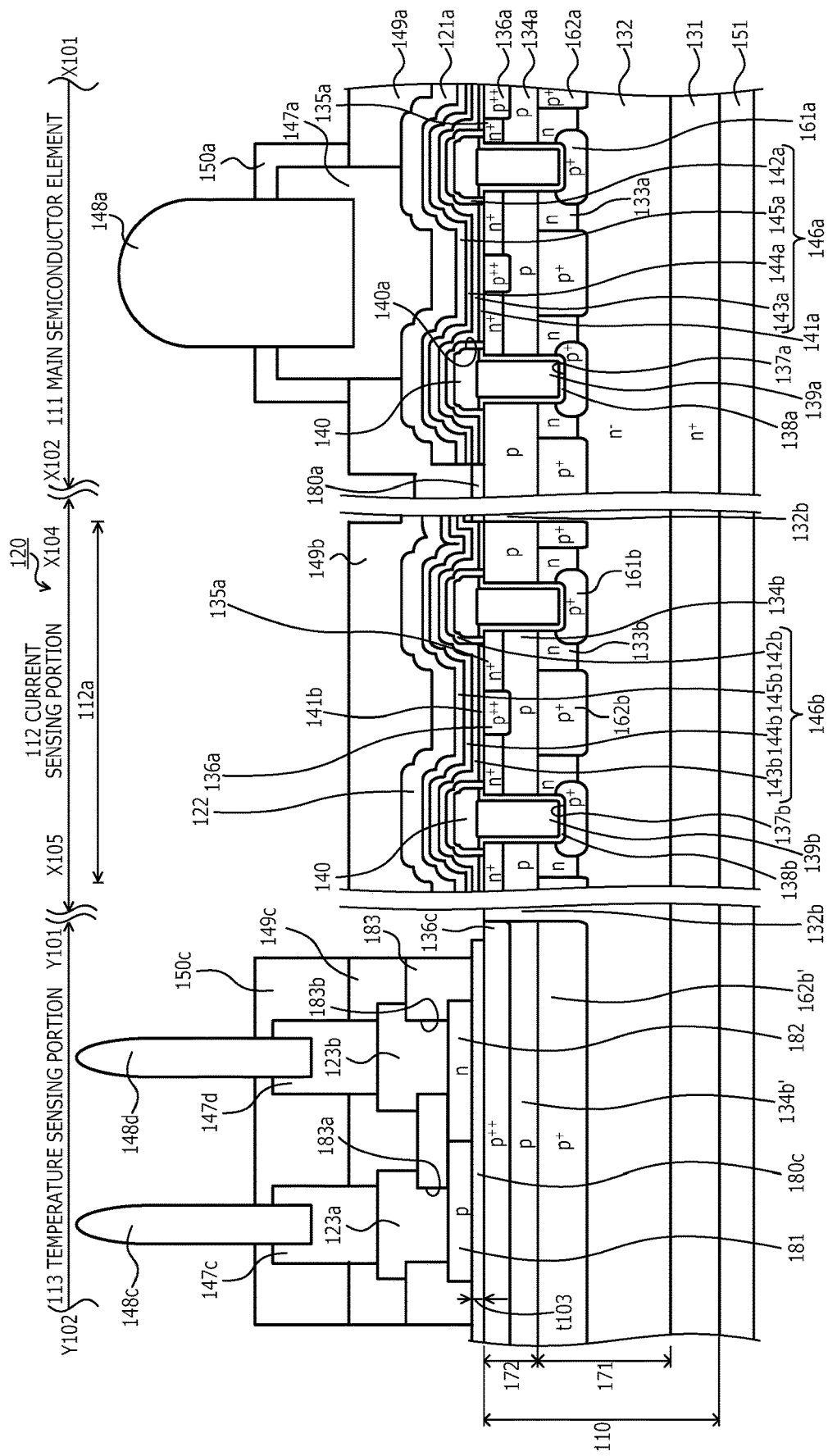
FIG. 18 is a cross-sectional view of the structure of the active region in FIG. 16.

In particular, the thicknesses t1, t3 of the field insulating film parts 80a, 80c, for example, are in a same range from about 0.6 μm to 0.8 μm as thicknesses t101, t102, t103 of parts 180a to 180c of a field insulating film of the conventional structure (refer to FIGS. 17 and 18). When the thicknesses t1, t3 of the field insulating film parts 80a, 80c, for example, are about 0.7 μm, the thickness t2 of the field insulating film part 80b, for example, may be about 1.0 μm.

The greater the thickness t2 of the field insulating film part 80b covering the $n^-$-type region 32b is set, the greater the electric field capability of the field insulating film part 80b may be enhanced. Therefore, directly beneath the field insulating film part 80b, in a surface region of the front surface of the semiconductor substrate 10, no p-type base region is provided and therefore, even when breakdown voltage decreases occur, dielectric breakdown of the field insulating film part 80b may be prevented.

In the sensing non-operating region 12b, on the field insulating film part 80b, the barrier metal 46b and the OC pad 22 extend from the sensing effective region 12a. In the sensing non-operating region 12b, the terminal pins 48b are bonded on the OC pad 22 by a wiring structure similar to the wiring structure on the source pad 21a. The terminal pins 48b are wiring members having a round bar-like (cylindrical) shape of a diameter smaller than that of the terminal pins 48a.

Figure 4:
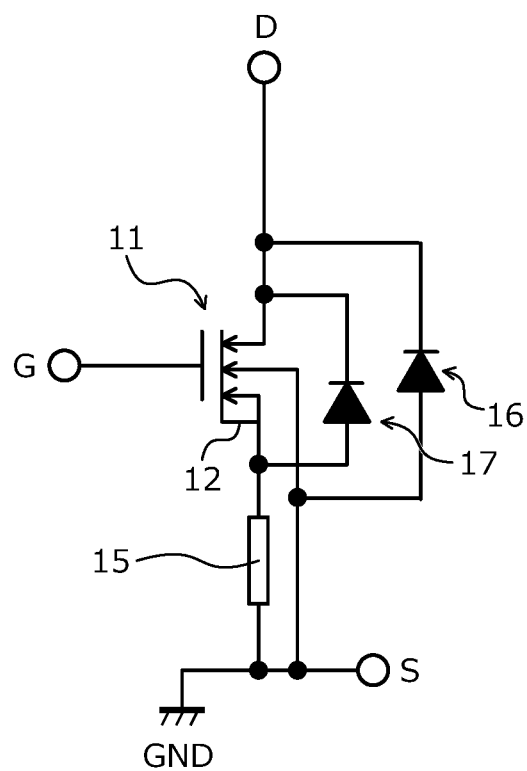
FIG. 4 is a circuit diagram depicting an equivalent circuit of the semiconductor device according to the first embodiment.

The terminal pins 48b, for example, are external connection terminals that lead out electric potential of the OC pad 22 and connect the OC pad 22 to a ground potential via an external resistor 15 (refer to FIG. 4). Disposal of the terminal pins 48b in the sensing non-operating region 12b enables pressure generated during bonding of the terminal pins 48b to be prevented from being applied to unit cells of the current sensing portion 12. Reference characters 47b, 49b, 50b are a plating film and first and second protective films that configure the wiring structure on the OC pad 22.

The temperature sensing portion 13, for example, is a polysilicon diode formed by a pn junction between a p-type polysilicon layer 81 that is a p-type anode region and an n-type polysilicon layer 82 that is an n-type cathode region. The p-type polysilicon layer 81 and the n-type polysilicon layer 82 are provided on the field insulating film part 80c in the main non-operating region 1b. The temperature sensing portion 13 is electrically insulated from the main semiconductor element 11 and the current sensing portion 12, by the field insulating film part 80c.

The field insulating film part 80c, the p-type polysilicon layer 81, and the n-type polysilicon layer 82 are covered by an interlayer insulating film 83. The anode pad 23a and the cathode pad 23b are in contact with the p-type polysilicon layer 81 and the n-type polysilicon layer 82 in third and fourth contact holes 83a, 83b of the interlayer insulating film 83, respectively. A material of the anode pad 23a and the cathode pad 23b, for example, is similar to that of the source pad 21a.

The terminal pins 48c, 48d are bonded on the anode pad 23a and on the cathode pad 23b, respectively, by a wiring structure similar to the wiring structure on the source pad 21a. The terminal pins 48c, 48d are external connection terminals that lead out electric potential of the anode pad 23a and the cathode pad 23b, respectively, to an external destination. The terminal pins 48c, 48d are wiring members having a round bar-like shape of a predetermined diameter.

Reference characters 47c, 47d are plating films respectively configuring the wiring structure on the anode pad 23a and the wiring structure on the cathode pad 23b. Reference characters 49c, 50c are respectively first and second protective films configuring the wiring structures on the temperature sensing portion 13. In a surface region of the front surface of the semiconductor substrate 10, the p-type base region 34c, the $p^{++}$-type contact region 36c, and the second $p^+$-type region 62c of the main non-operating region 1b and described above extend directly beneath the temperature sensing portion 13.

While not depicted, the gate pad 21b is provided on the field insulating film part 80c. A barrier metal having a stacked structure similar to that of the barrier metal 46a may be provided between the gate pad 21b and the field insulating film part 80c. A material of the gate pad 21b, for example, is similar to that of the source pad 21a. On the gate pad 21b as well, for example, terminal pins are bonded by a wiring structure (not depicted) similar to the wiring structure on the source pad 21a.

In a surface region of the front surface of the semiconductor substrate 10, the p-type base region 34c, the $p^{++}$-type contact region 36c, and the second $p^+$-type region 62c also extend directly beneath a gate pad portion 14, similarly to directly beneath the anode pad 23a and the cathode pad 23b. In other words, in the depth direction Z, the p-type base region 34c, the $p^{++}$-type contact region 36c, and the second p$^+$-type region 62c oppose surfaces of all the electrode pads of the main non-operating region 1b other than the OC pad 22.

The p-type base region 34c, the p$^{++}$-type contact region 36c, and the second p$^+$-type region 62c, as described above, oppose a portion of the OC pad 22 according to a surface area ratio of the sensing effective region 12a and the n$^-$-type region 32b of the main non-operating region 1b. The p-type base region 34c, the p$^{++}$-type contact region 36c, and the second p$^+$-type region 62c, for example, have depths and impurity concentrations equal to those of the p-type base region 34a, the p$^{++}$-type contact regions 36a, and the second p$^+$-type regions 62a of the main semiconductor element 11, respectively.

Operation of the semiconductor device 20 according to the first embodiment will be described. FIG. 4 is a circuit diagram depicting an equivalent circuit of the semiconductor device according to the first embodiment. As depicted in FIG. 4, the current sensing portion 12 is connected in parallel to plural MOSFET unit cells configuring the main semiconductor element 11. A ratio (hereinafter, current sensing ratio) of a sensing current flowing in the current sensing portion 12 and the main current flowing in the main semiconductor element 11 is preset.

The current sensing ratio, for example, may be set by changing the quantity of unit cells in the main semiconductor element 11 and in the current sensing portion 12. A sensing current that is smaller than the main current that flows in the main semiconductor element 11 flows in the current sensing portion 12, corresponding to the current sensing ratio. A source of the main semiconductor element 11 is connected to a grounding point GND of the ground potential. The resistor 15, which is an external component, is connected between the grounding point GND and a source of the current sensing portion 12.

In a state where voltage that is positive with respect to the source electrode of the main semiconductor element 11 (the source pad 21a) is applied to the drain electrode 51, when voltage that is at least equal to a threshold voltage is applied to the gate electrodes 39a of the main semiconductor element 11, an n-type inverse layer (channel) is formed in a portion of the p-type base region 34a of the main semiconductor element 11 sandwiched between the n$^+$-type source regions 35a and the n-type current spreading region 33a. As a result, the main current flows from the drain of the main semiconductor element 11 toward the source thereof and the main semiconductor element 11 turns ON.

Here, in a state in which voltage that is positive with respect to the source electrode (the OC pad 22) of the current sensing portion 12 is applied to the drain electrode 51 under conditions similar to those of the main semiconductor element 11, when voltage at least equal to the threshold voltage is applied to the gate electrodes 39b of the current sensing portion 12, an n-type inverse layer is formed in a portion of the p-type base region 34b of the sensing effective region 12a, the portion sandwiched between the n$^+$-type source regions 35b and the n-type current spreading region 33b. As a result, sensing current from the drain of the current sensing portion 12 toward the source thereof flows and the current sensing portion 12 turns ON.

The sensing current passes through the resistor 15 connected to the source of the current sensing portion 12 and flows to the grounding point GND. As a result, a voltage decrease occurs at the resistor 15. When overcurrent is applied to the main semiconductor element 11, the sensing current of the current sensing portion 12 increases according to the magnitude of the overcurrent to the main semiconductor element 11 and the voltage decrease at the resistor 15 also increases. The magnitude of the voltage decrease at the resistor 15 is monitored, thereby enabling detection of the overcurrent in the main semiconductor element 11.

On the other hand, when voltage less than the threshold voltage is applied to the gate electrodes 39a of the main semiconductor element 11, pn junctions between the first and the second p$^+$-type regions 61a, 62a, the n-type current spreading region 33a, and the n$^-$-type drift region 32 of the main semiconductor element 11 are reverse biased. The voltage that is less than the threshold voltage is further applied to the gate electrodes 39b of the current sensing portion 12 and pn junctions between the first and the second p$^+$-type regions 61b, 62b, the n-type current spreading region 33b, and the n$^-$-type drift region 32 of the current sensing portion 12 are also reverse biased. As a result, the main current of the main semiconductor element 11 and the sensing current of the current sensing portion 12 are blocked; and the main semiconductor element 11 and the current sensing portion 12 maintain the OFF state.

During the OFF state of the main semiconductor element 11, when current that is negative with respect to the source electrode of the main semiconductor element 11 is applied to the drain electrode 51, a parasitic diode 16 formed by pn junctions between the p-type base region 34a, the first and the second p$^+$-type regions 61a, 62a, the n-type current spreading region 33a, and the n$^-$-type drift region 32 of the main effective region 1a of the active region 1 conducts. Further, the parasitic diode 16 formed by pn junctions between the p-type base region 34c, the second p$^+$-type regions 62a, and the n$^-$-type drift region 32 of the main non-operating region 1b of the active region 1 conducts.

During the OFF state of the current sensing portion 12 as well, voltage that is negative with respect to the source electrode of the current sensing portion 12 is applied to the drain electrode 51 and the parasitic diode 17 formed by pn junctions between the p-type base region 34b, the first and the second p$^+$-type regions 61b, 62b, the n-type current spreading region 33b, and the n$^-$-type drift region 32 of the sensing effective region 12a of the main non-operating region 1b of the active region 1 conducts. A parasitic diode formed by a pn junction between the p-type region for element isolation of the edge termination region 2 and the n$^-$-type drift region 32 conducts.

On the other hand, in a region (in FIG. 1, entire region of the sensing non-operating region 12b of the main non-operating region 1b) in which the n$^-$-type region 32b of the main non-operating region 1b is disposed, no p-type base region is disposed and therefore, no parasitic diode is formed. This region of the main non-operating region 1b in which no parasitic diode is formed is disposed so as to surround a periphery of the sensing effective region 12a. Therefore, the region in which no parasitic diode is formed is present between the parasitic diode 16 of the main semiconductor element 11 and the parasitic diode 17 of the current sensing portion 12.

Thus, when the main semiconductor element 11 and the current sensing portion 12 switch from OFF to ON and the parasitic diodes turn OFF, hole current (reverse recovery current of the parasitic diode 16 of the main semiconductor element 11) generated in the n$^-$-type drift region 32 of the main effective region 1a does not easily flow into the p-type base region 34b of the current sensing portion 12 due to the n$^-$-type region 32b of the main non-operating region 1b, passes through the p-type base region 34a of the main semiconductor element 11 and out to the source pad 21a.

The hole current that passes through the p-type base region 34b of the current sensing portion 12 and out to the OC pad 22 may be set to be, substantially, only the hole current (reverse recovery current of the parasitic diode 17 of the current sensing portion 12) generated in the n⁻-type drift region 32 near the sensing effective region 12a. As a result, the hole current generated by the main effective region 1a may be prevented from flowing excessively to the p-type base region 34b of the sensing effective region 12a. As a result, electric field applied to the current sensing portion 12 may be mitigated and therefore, ESD capability of the current sensing portion 12 increases, enabling the reverse recovery capability of the parasitic diode of the main non-operating region 1b to be increased.

A method of manufacturing the semiconductor device 20 according to the first embodiment will be described. FIGS. 5, 6, 7, 8, 9, and 10 are cross-sectional views of the semiconductor device according to the first embodiment during manufacture. In FIGS. 5 to 10, while only the main semiconductor element 11 is depicted, each part of all elements fabricated (manufactured) on the semiconductor substrate 10 having the main semiconductor element 11, for example, are formed concurrently with each part of the main semiconductor element 11. Formation of each part of the current sensing portion 12, the temperature sensing portion 13, and the gate pad portion 14 will be described with reference to FIGS. 1 to 3.

Figure 5:
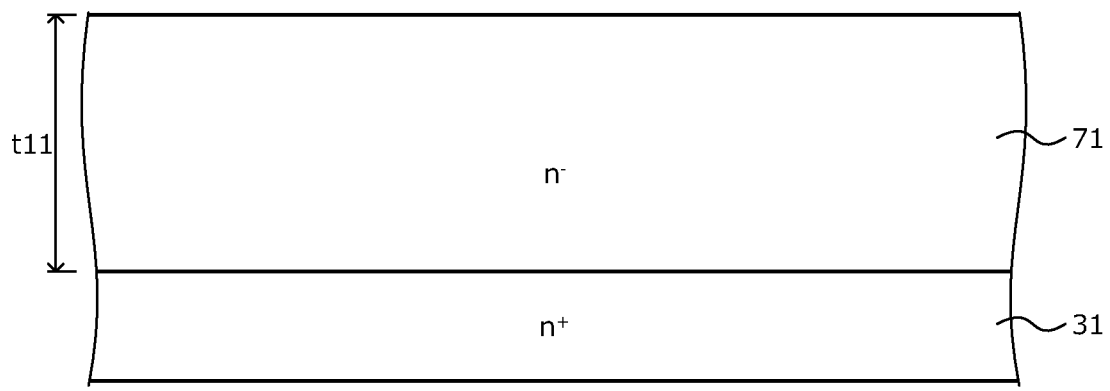
FIG. 5 is a cross-sectional view of the semiconductor device according to the first embodiment during manufacture.

First, as depicted in FIG. 5, the n⁺-type starting substrate (semiconductor wafer) 31 containing silicon carbide is prepared. The n⁺-type starting substrate 31, for example, may be a silicon carbide single crystal substrate doped with nitrogen (N). Next, on a front surface of the n⁺-type starting substrate 31, the n⁻-type silicon carbide layer 71 doped with a lower concentration of nitrogen than is the n⁺-type starting substrate 31 is formed by epitaxial growth. When the main semiconductor element 11 has a breakdown voltage of 3300V, a thickness t11 of the n⁻-type silicon carbide layer 71, for example, may be about 30 μm.

Figure 6:
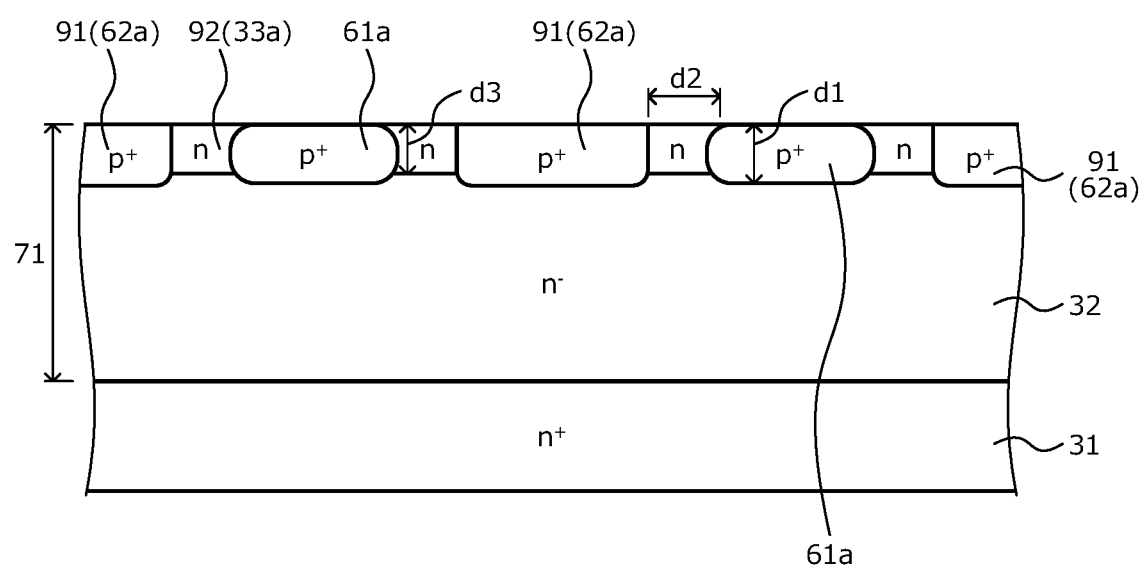
FIG. 6 is a cross-sectional view of the semiconductor device according to the first embodiment during manufacture.

Next, as depicted in FIG. 6, by photolithography and, for example, ion implantation of a p-type impurity such as Al, the first p⁺-type regions 61a and p⁺-type regions 91 are selectively formed in a surface region of the n⁻-type silicon carbide layer 71 in the main effective region 1a. The p⁺-type regions 91 are a part of the second p⁺-type regions 62a. The first p⁺-type regions 61a and the p⁺-type regions 91, for example, are disposed to repeatedly alternate each other along the first direction X depicted in FIG. 1.

A distance d2 between one of the first p⁺-type regions 61a and one of the p⁺-type regions 91 adjacent to each other, for example, may be about 1.5 μm. A depth d1 and an impurity concentration of the first p⁺-type regions 61a and the p⁺-type regions 91, for example, may be about 0.5 μm and about $5.0 \times 10^{18}/cm^3$, respectively. Subsequently, an ion implantation mask (not depicted) used in forming the first p⁺-type regions 61a and the p⁺-type regions 91 is removed.

Next, by photolithography and, for example, ion implantation of an n-type impurity such as nitrogen, n-type regions 92 are formed in surface regions of the n⁻-type silicon carbide layer 71, spanning the main effective region 1a overall. The n-type regions 92, for example, are formed between the first p⁺-type regions 61a and the p⁺-type regions 91, to be in contact with these regions. A depth d3 and an impurity concentration of the n-type regions 92, for example, may be about 0.4 μm and about $1.0 \times 10^{17}/cm^3$, respectively.

The n-type regions 92 are a part of the n-type current spreading region 33a. A portion of the n⁻-type silicon carbide layer 71 sandwiched between the n-type regions 92, the first p⁺-type regions 61a, the p⁺-type regions 91, and the n⁺-type starting substrate 31 is the n⁻-type drift region 32. Next, an ion implantation mask (not depicted) used in forming the n-type regions 92 is removed. A sequence in which the n-type regions 92, the first p⁺-type regions 61a, and the p⁺-type regions 91 are formed may be interchanged.

Figure 7:
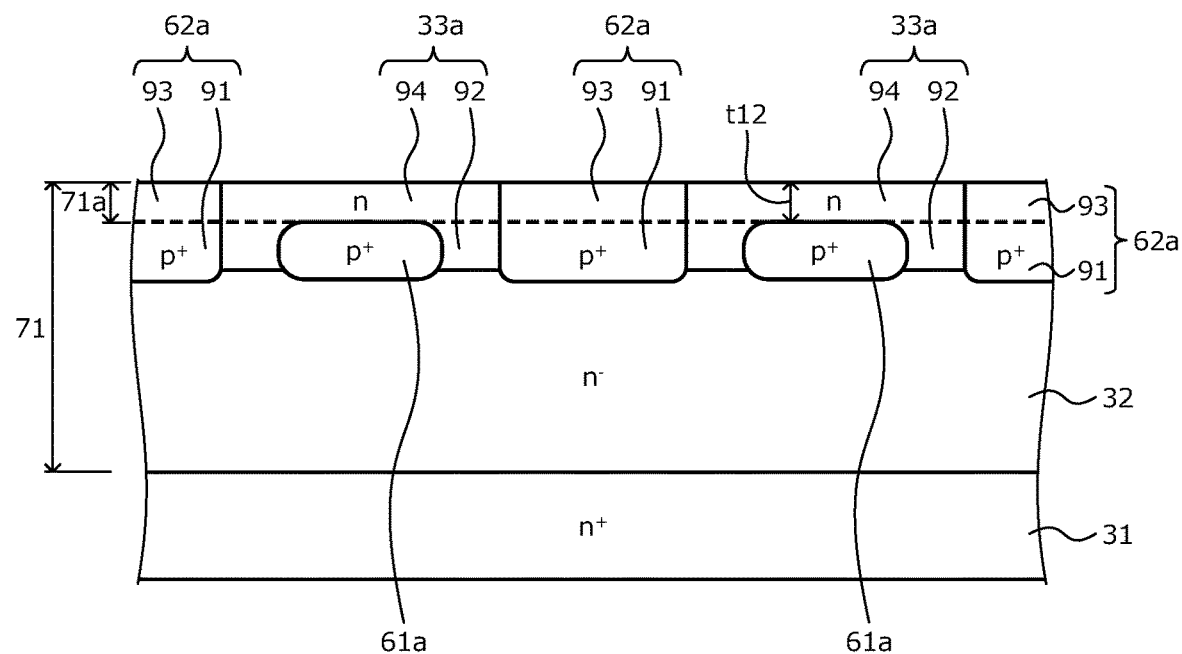
FIG. 7 is a cross-sectional view of the semiconductor device according to the first embodiment during manufacture.

Next, as depicted in FIG. 7, on the n⁻-type silicon carbide layer 71, for example, an n⁻-type silicon carbide layer doped with an n-type impurity such as nitrogen is further formed, for example, to have a thickness t12 of 0.5 μm, thereby increasing the thickness of the n⁻-type silicon carbide layer 71.

Next, by photolithography and ion implantation of a p-type impurity such as Al, in a portion 71a increasing the thickness of the n⁻-type silicon carbide layer 71, p⁺-type regions 93 are selectively provided to a depth reaching the p⁺-type regions 91. The p⁺-type regions 91, 93 that are adjacent to each other in the depth direction Z are connected and form the second p⁺-type regions 62a. A width and an impurity concentration of the p⁺-type regions 93, for example, are substantially equal to those of the p⁺-type regions 91. Next, an ion implantation mask used in forming the p⁺-type regions 93 (not depicted) is removed.

Next, by photolithography and, for example, ion implantation of an n-type impurity such as nitrogen, in the portion 71a increasing the thickness of the n⁻-type silicon carbide layer 71, n-type regions 94 are selectively formed to a depth reaching the n-type regions 92. An impurity concentration of the n-type regions 94, for example, is substantially equal to that of the n-type regions 92. The n-type regions 92, 94 that are adjacent to each other in the depth direction Z are connected, whereby the n-type current spreading region 33a is formed. A sequence in which the p⁺-type regions 93 and the n-type regions 94 are formed may be interchanged. Next, an ion implantation mask (not depicted) used in forming the n-type regions 94 is removed.

Figure 8:
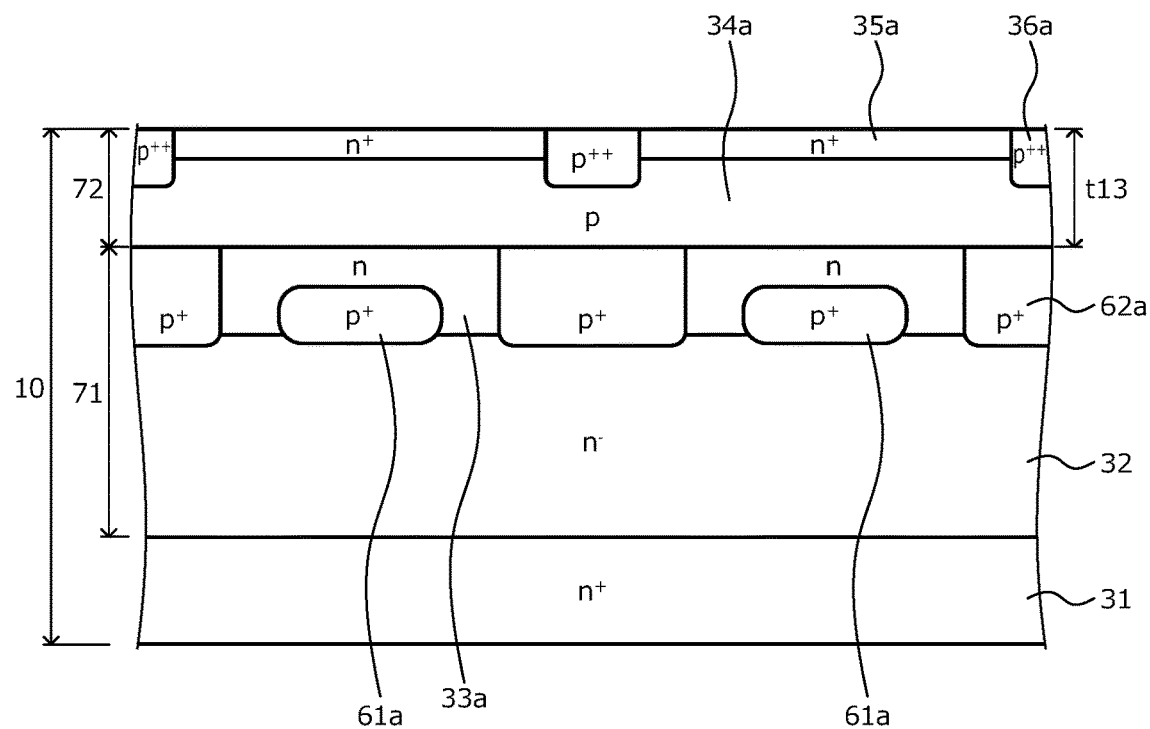
FIG. 8 is a cross-sectional view of the semiconductor device according to the first embodiment during manufacture.

Next, as depicted in FIG. 8, on the n⁻-type silicon carbide layer 71, for example, the p-type silicon carbide layer 72 doped with a p-type impurity such as Al is formed by epitaxial growth. A thickness t13 and an impurity concentration of the p-type silicon carbide layer 72, for example, may be about 1.3 μm and about $4.0 \times 10^{17}/cm^3$, respectively. As a result, the semiconductor substrate (semiconductor wafer) 10 in which the n⁻-type silicon carbide layer 71 and the p-type silicon carbide layer 72 are sequentially stacked on the n⁺-type starting substrate 31 by epitaxial growth is formed.

Next, a process including photolithography, ion implantation, and removal of the ion implantation mask as one set is repeatedly performed under different conditions, thereby selectively forming in the p-type silicon carbide layer 72, the n⁺-type source regions 35a and the p⁺⁺-type contact regions 36a in the main effective region 1a and the n⁻-type region 32b (refer to FIGS. 2 and 3) in the main non-operating region 1b. A region of the main non-operating region 1b directly beneath the OC pad 22 and the main effective region 1a are separated from each other by the n⁻-type region 32b.

A sequence in which the n⁺-type source regions 35a, the p⁺⁺-type contact regions 36a, and the n⁻-type region 32b are formed may be interchanged. In the main effective region 1a, a portion sandwiched by the n⁺-type source regions 35a, the p⁺⁺-type contact regions 36a, and the n⁻-type silicon carbide layer 71 is the p-type base region 34a. In the ion implantations described above, for example, a resist film or an oxide film may be used as an ion implantation mask.

Next, with respect to diffusion regions (the first and the second p$^+$-type regions 61a, 62a, the n-type current spreading region 33a, the n$^+$-type source regions 35a, the p$^{++}$-type contact regions 36a, and the n$^-$-type region 32b) formed by ion implantation, for example, a heat treatment (activation annealing) for impurity activation is performed at a temperature of about 1700 degrees C. for about 2 minutes. The activation annealing may be performed once for all of the diffusion regions collectively after formation or may be performed each ion implantation for forming the diffusion regions.

Figure 9:
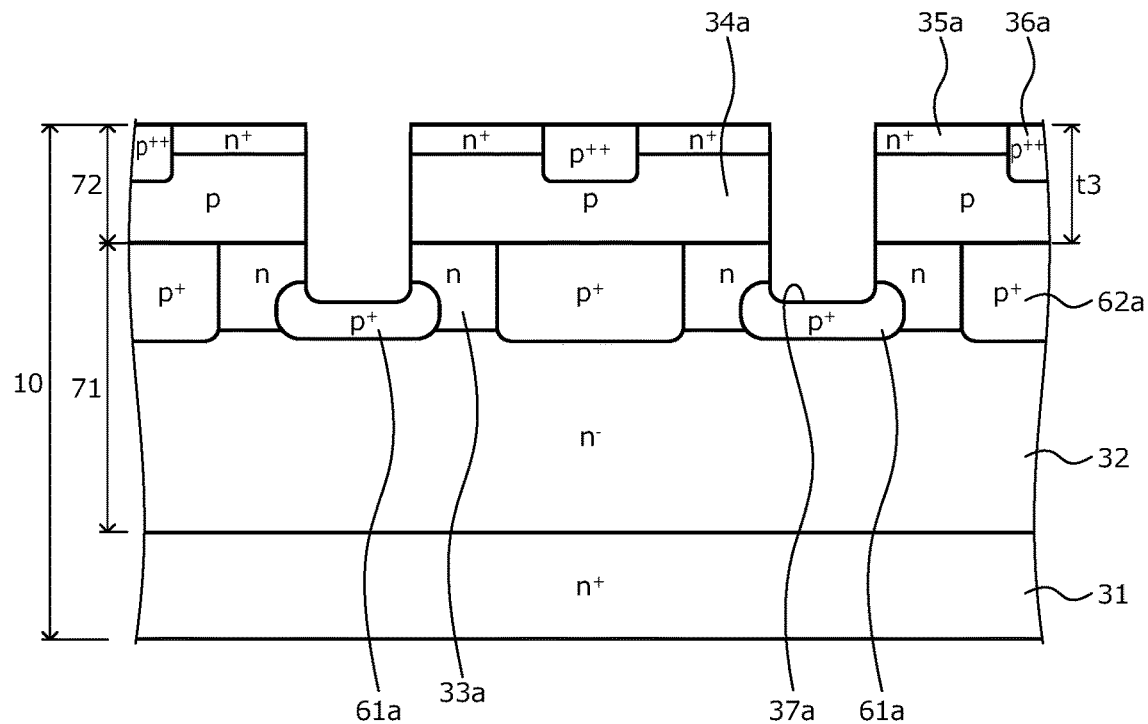
FIG. 9 is a cross-sectional view of the semiconductor device according to the first embodiment during manufacture.

Next, as depicted in FIG. 9, by photolithography and, for example, dry etching, the trenches 37a that penetrate through the n$^+$-type source regions 35a and the p-type base region 34a are formed. The trenches 37a, for example, have a depth reaching the first p$^+$-type regions 61a in the n-type current spreading region 33a. As an etching mask for forming the trenches 37a, for example, a resist mask or an oxide mask may be used. Subsequently, the etching mask is removed.

Figure 10:
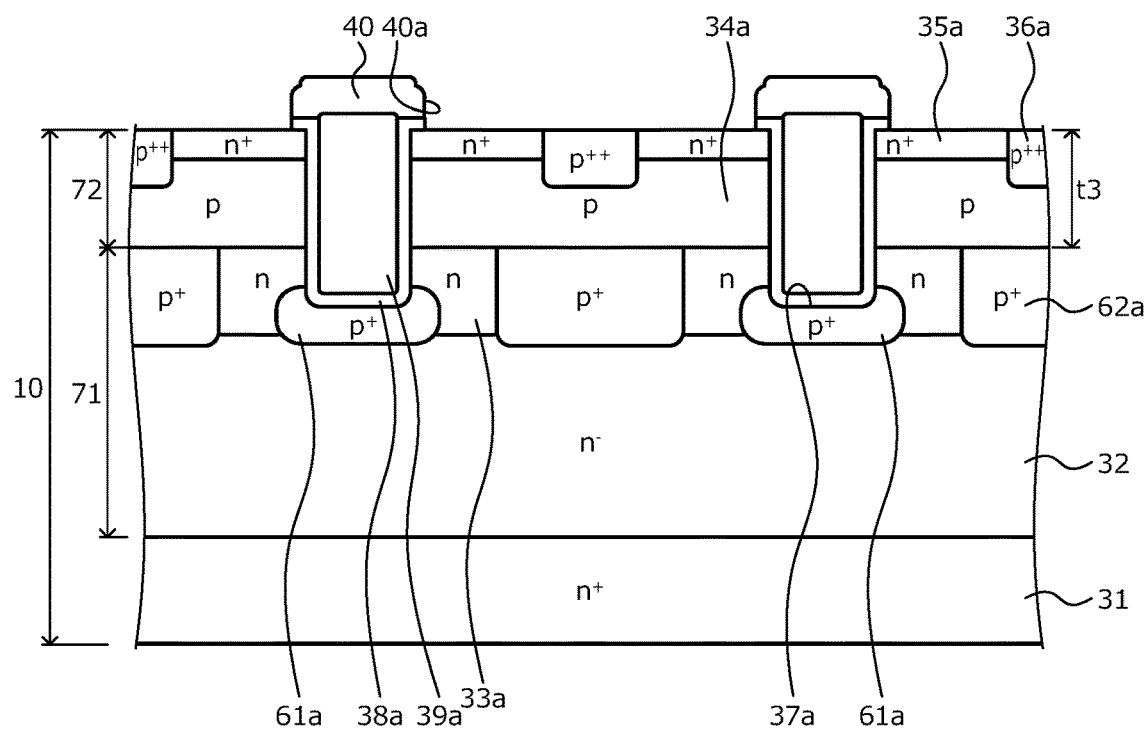
FIG. 10 is a cross-sectional view of the semiconductor device according to the first embodiment during manufacture.

Next, as depicted in FIG. 10, the gate insulating film 38a is formed along the surface of the semiconductor substrate 10 and inner walls of the trenches 37a. The gate insulating film 38a, for example, may be a thermal oxide film formed by a temperature of about 1000 degrees C. in an oxygen (O$_2$) atmosphere, or a deposited film of a high temperature oxide (HTO). Next, in the trenches 37a, on the gate insulating film 38a, for example, a polysilicon layer doped with phosphorus is formed as the gate electrodes 39a.

All elements (for example, the current sensing portion 12, for example, a diffusion diode forming the over-voltage protecting portion, a complementary MOS (CMOS) configuring the arithmetic circuit portion) other than the main semiconductor element 11, suffice to be formed in the main non-operating region 1b of the semiconductor substrate 10, concurrently with the corresponding parts of the main semiconductor element 11 when the parts of the main semiconductor element 11 described above are formed.

For example, diffusion regions of elements disposed on the semiconductor substrate 10 suffice to be formed concurrently with diffusion regions having the same conductivity type, impurity concentration and diffusion depth among the diffusion regions configuring the main semiconductor element 11. Further, gate trenches, gate insulating films, and gate electrodes of elements disposed on the semiconductor substrate 10 suffice to be formed concurrently with the trenches 37a, the gate insulating film 38a, and the gate electrodes 39a of the main semiconductor element 11, respectively.

Next, on the front surface of the semiconductor substrate 10, the field insulating film parts 80a to 80c are formed having the thicknesses t1 to t3, respectively. Here, after a field insulating film having thicknesses equal to the thicknesses t1, t3 of the field insulating film parts 80a, 80c is formed, a field insulating film may be further deposited only on a part that becomes the field insulating film part 80b to increase only the thickness thereof to the thickness t2. Alternatively, after a field insulating film of a thickness equal to the thickness t2 of the field insulating film part 80b is formed, surface regions may be selectively removed by dry etching only portions that become the field insulating film parts 80a, 80c to reduce the thicknesses thereof to the thicknesses t1, t3.

Next, on the field insulating film part 80c, for example, a polysilicon layer doped with phosphorus and becoming the n-type polysilicon layer 82 is deposited and a portion of the polysilicon layer is set as a p-type region, thereby forming the p-type polysilicon layer 81. Next, the polysilicon layer is patterned, leaving only portions forming the p-type polysilicon layer 81 and the n-type polysilicon layer 82. The gate runner (not depicted) may be formed concurrently with the p-type polysilicon layer 81 and the n-type polysilicon layer 82.

Next, on the front surface of the semiconductor substrate 10 overall, the interlayer insulating films 40, 83 are formed. The interlayer insulating films 40, 83, for example, may be a phosphosilicate glass (PSG). A thickness of the interlayer insulating films 40, 83, for example, may be about 1 μm. Next, by photolithography and etching, the interlayer insulating film 40 and the gate insulating films 38a, 38b are selectively removed, forming the first and the second contact holes 40a, 40b.

Here, the first contact holes 40a exposing the n$^+$-type source regions 35a and the p$^{++}$-type contact regions 36a of the main semiconductor element 11 are formed. The second contact holes 40b exposing the n$^+$-type source regions 35b and the p$^{++}$-type contact regions 36b of the current sensing portion 12 are formed in the sensing effective region 12a. Next, by a heat treatment, the interlayer insulating films 40, 83 are planarized (reflow).

Next, for example, by sputtering, the first TiN films 42a, 42b are formed on the front surface of the semiconductor substrate 10 overall. The first TiN films 42a, 42b cover the entire surfaces of the interlayer insulating films 40, 83 and portions (the n$^+$-type source regions 35a, 35b and the p$^{++}$-type contact regions 36a, 36b) of the front surface of the semiconductor substrate 10 exposed by the first and the second contact holes 40a, 40b.

Next, by photolithography and etching, portions of the first TiN films 42a, 42b covering the semiconductor substrate 10 in the first and the second contact holes 40a, 40b are removed, again exposing the n$^+$-type source regions 35a, 35b and the p$^{++}$-type contact regions 36a, 36b. As a result, the first TiN films 42a, 42b are left as the barrier metals 46a, 46b on the entire surfaces of the interlayer insulating films 40, 83.

Next, for example, by sputtering, on semiconductor portions (the front surface of the semiconductor substrate 10) exposed by the first and the second contact holes 40a, 40b, a Ni film (not depicted) is formed. Here, the Ni film is further formed on the first TiN films 42a, 42b. Next, for example, by a heat treatment of about 970 degrees C., a silicide is formed where the Ni film is in contact with the semiconductor portions, thereby forming the NiSi films 41a, 41b that are in ohmic contact with the semiconductor portions.

During the heat treatment for converting this nickel into a silicide, the first TiN films 42a, 42b are disposed between the interlayer insulating films 40, 83 and the Ni film, whereby diffusion of nickel atoms in the nickel film into the interlayer insulating films 40, 83 may be prevented. A portion of the Ni film on the interlayer insulating films 40, 83 is not in contact with a semiconductor portion and therefore, is not converted into a silicide. Thereafter, the portion of the Ni film on the interlayer insulating films 40, 83 is removed, exposing the interlayer insulating films 40, 83.

Next, on the back surface of the semiconductor substrate 10, for example, a Ni film is formed. Next, for example, by a heat treatment of about 970 degrees C., the Ni film is converted into a silicide, thereby forming as the drain electrode 51, a NiSi film in ohmic contact with a semiconductor portion (back surface of the semiconductor substrate 10). The heat treatment for silicide conversion when the NiSi film that becomes the drain electrode 51 is formed may be performed concurrently with the heat treatment for forming the NiSi films 41a, 41b of the front surface of the semiconductor substrate 10.

Next, by sputtering, on the front surface of the semiconductor substrate 10, the first Ti films 43a, 43b, the second TiN films 44a, 44b, and the second Ti films 45a, 45b forming the barrier metals 46a, 46b; and an Al film (or an aluminum alloy film) forming the source pad 21a, the gate pad 21b, and the OC pad 22 are sequentially stacked. A thickness of the Al film, for example, is at most about 5 μm.

Next, by photolithography and etching, a metal film deposited on the front surface of the semiconductor substrate 10 is patterned, leaving portions becoming the barrier metals 46a, 46b, the source pad 21a, the gate pad 21b, the OC pad 22, the OV pad (not depicted) of the over-voltage protecting portion, and the electrode pad (not depicted) of the arithmetic circuit portion. Formation of the metal film on the front surface of the semiconductor substrate 10 is performed in a state in which the temperature sensing portion 13, for example, is covered by a resist mask.

Next, after the resist mask covering the temperature sensing portion 13 is removed, by photolithography and etching, the interlayer insulating film 83 is selectively removed, forming the third and the fourth contact holes 83a, 83b, and exposing the p-type polysilicon layer 81 and the n-type polysilicon layer 82 in the third and the fourth contact holes 83a, 83b. Next, by a heat treatment, the interlayer insulating film 83 is planarized.

Next, an Al film (or an aluminum alloy film) is formed on the front surface of the semiconductor substrate 10 so as to be embedded in the third and the fourth contact holes 83a, 83b, whereby the anode pad 23a and the cathode pad 23b of the temperature sensing portion 13 are formed. Next, for example, by sputtering, on the surface of the drain electrode 51, for example, a Ti film, a Ni film, and a gold (Au) film are sequentially stacked, forming the drain pad (not depicted).

Next, for example, the front surface of the semiconductor substrate 10 is protected by a polyimide film by a chemical vapor deposition (CVD) method. Next, by photolithography and etching, the polyimide film is selectively removed, thereby forming and opening the first protective films 49a to 49c that cover electrode pads respectively.

Next, after a general plating pretreatment, the plating films 47a to 47d are formed by a general plating process in portions of the electrode pads 21a, 21b, 22, 23a, 23b exposed in the openings of the first protective films 49a to 49c. Here, the first protective films 49a to 49c function as masks that suppress wet spreading of the plating films 47a to 47d. A thickness of the plating films 47a to 47d, for example, may be about 5 μm.

Next, for example, by a CVD method, a polyimide film becoming the second protective films 50a to 50c that cover each of the borders between the plating films 47a to 47d and the first protective films 49a to 49c is formed. Next, the terminal pins 48a to 48d are bonded on the plating films 47a to 47d by respective solder layers (not depicted). Here, the second protective films 50a to 50c function as masks that suppress wet spreading of the solder layers.

Thereafter, the semiconductor substrate 10 is diced (cut) into individual chips, whereby the semiconductor device 20 depicted in FIGS. 1 to 3 is completed.

As described above, according to the first embodiment, unit cells of the current sensing portion are disposed in a portion directly beneath the OC pad of the main non-operating region of the active region as the sensing effective region and directly beneath the OC pad of the main non-operating region, a region surrounding a periphery of the sensing effective region is set as the sensing non-operating region in which no unit cells of the current sensing portion are disposed. In the sensing non-operating region, no p-type base region is disposed, only an n-type region is disposed. As a result, directly beneath the OC pad of the main non-operating region, a parasitic diode is formed only in the sensing effective region and no parasitic diode is formed in the sensing non-operating region.

In other words, between the parasitic diode of the main semiconductor element of the main effective region and the parasitic diode of the current sensing portion of the sensing effective region, the sensing non-operating region in which no parasitic diode is formed is present. Therefore, the main semiconductor element and the current sensing portion concurrently switch from OFF to ON and when the main semiconductor element and the parasitic diode of the current sensing portion concurrently turn OFF, hole current (reverse recovery current of the parasitic diode of the main semiconductor element) generated in the main effective region may be suppressed from flowing into the current sensing portion and the reverse recovery capability of the parasitic diode in the main non-operating region may be enhanced.

Further, according to the first embodiment, in the sensing non-operating region in which only the n$^-$-type region is disposed in a surface region of the front surface of the semiconductor substrate, the thickness of the field insulating film at a part thereof covering the n$^-$-type region is increased, whereby at the part covering the n$^-$-type region, the electric field capability of the field insulating film may be enhanced. Therefore, directly beneath the part of the field insulating film covering the n$^-$-type region, no p-type base region is provided in a surface region of the front surface of the semiconductor substrate and as a result, even when breakdown voltage decreases occur, dielectric breakdown of the field insulating film may be suppressed.

Further, according to the first embodiment, in the sensing non-operating region, only the n$^-$-type region is disposed in a surface region of the front surface of the semiconductor substrate, whereby electric field applied to an end of the second p$^+$-type region that, in the main semiconductor element, is nearest the sensing non-operating region is mitigated, the end that is toward the sensing non-operating region. Further, in the sensing non-operating region, only the n$^-$-type region is disposed in a surface region of the front surface of the semiconductor substrate, whereby electric field applied to an end of the second p$^+$-type region, that in the current sensing portion is nearest the sensing non-operating region, is mitigated, the end that is toward the sensing non-operating region. As a result, breakdown voltage in the sensing non-operating region may be enhanced.

Figure 11:
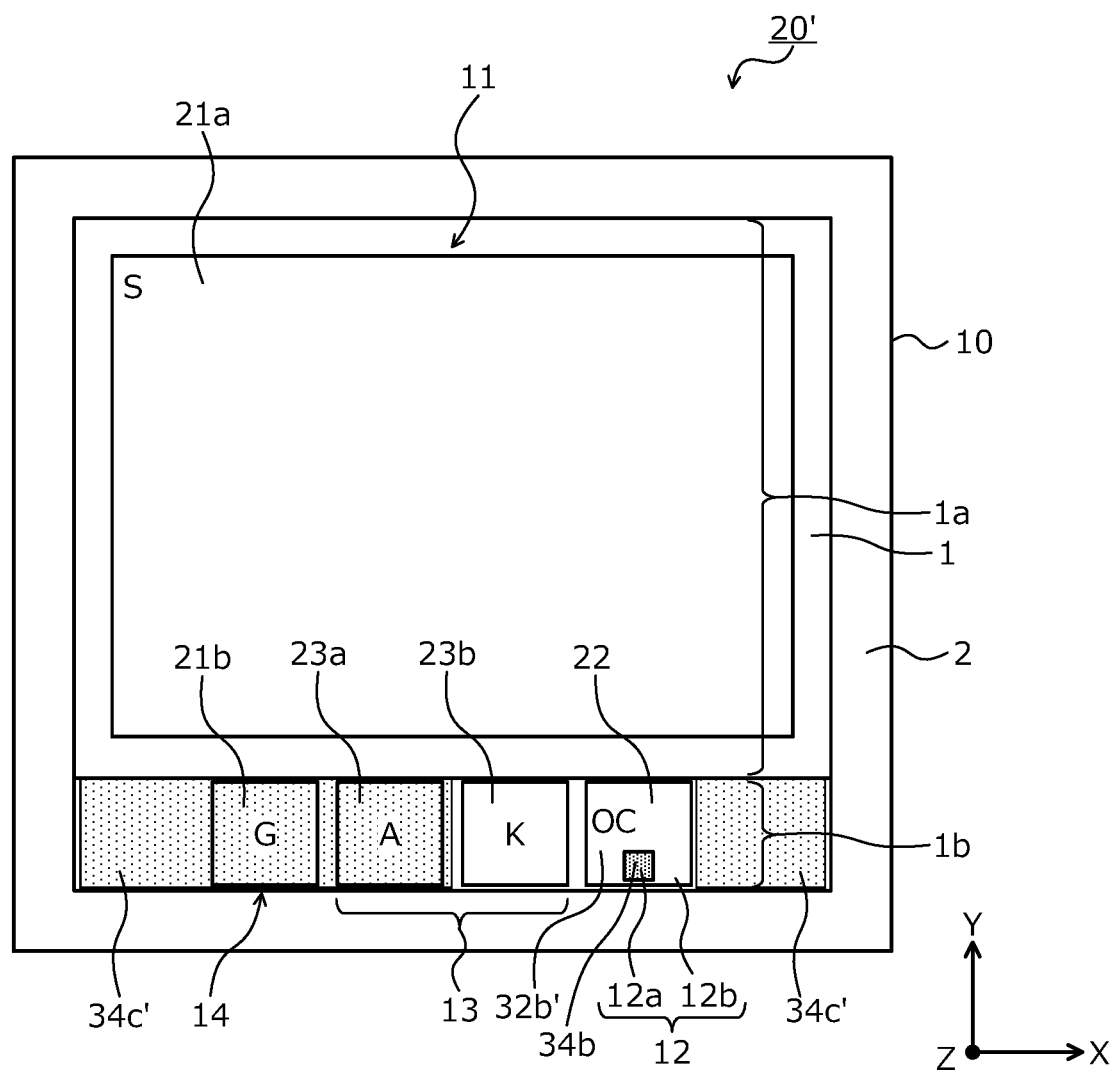
FIG. 11 is a plan view of an example of a layout when a semiconductor device according to a second embodiment is viewed from the front side of the semiconductor substrate.
Figure 12:
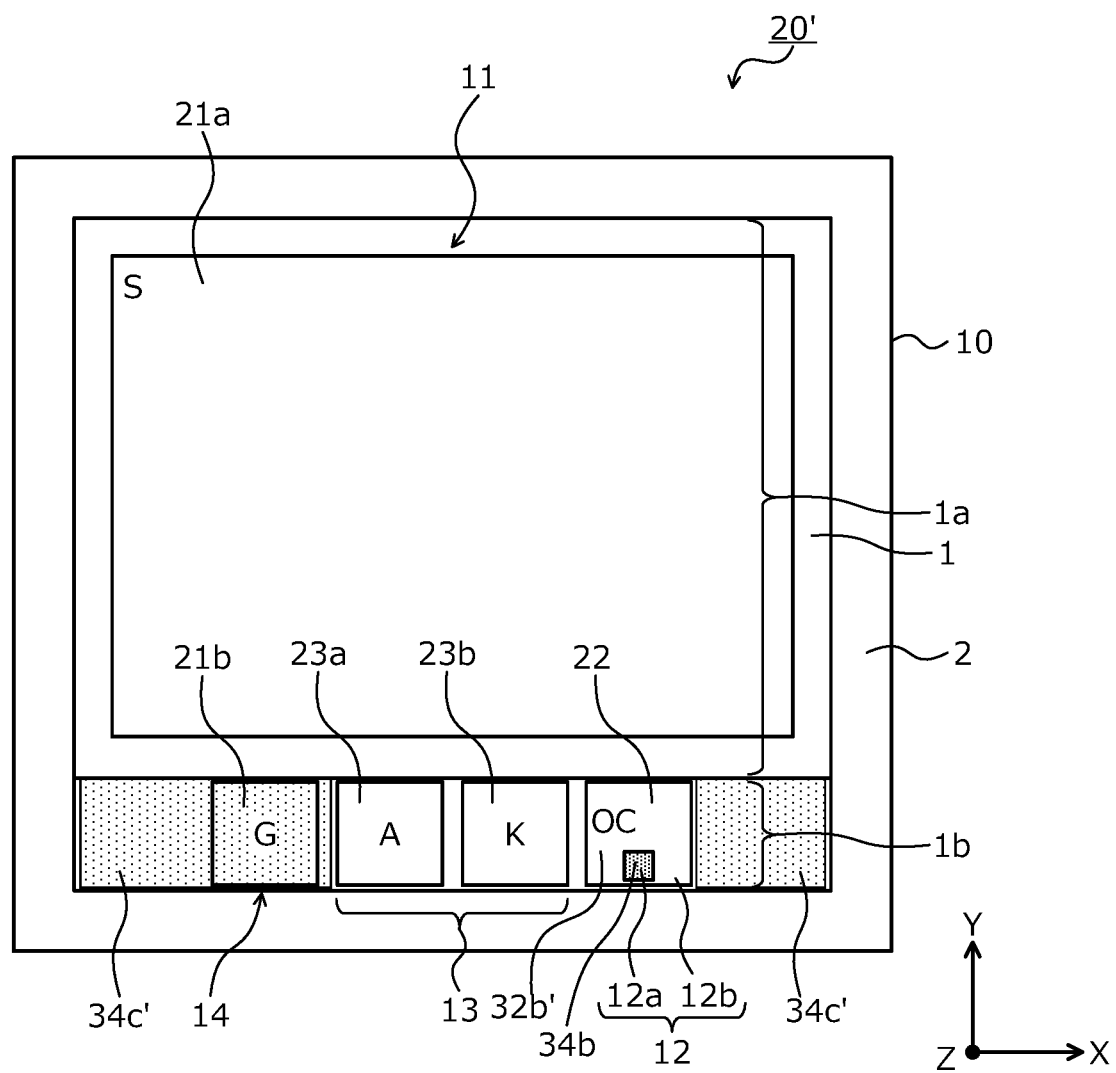
FIG. 12 is a plan view of an example of a layout when the semiconductor device according to the second embodiment is viewed from the front side of the semiconductor substrate.
Figure 13:
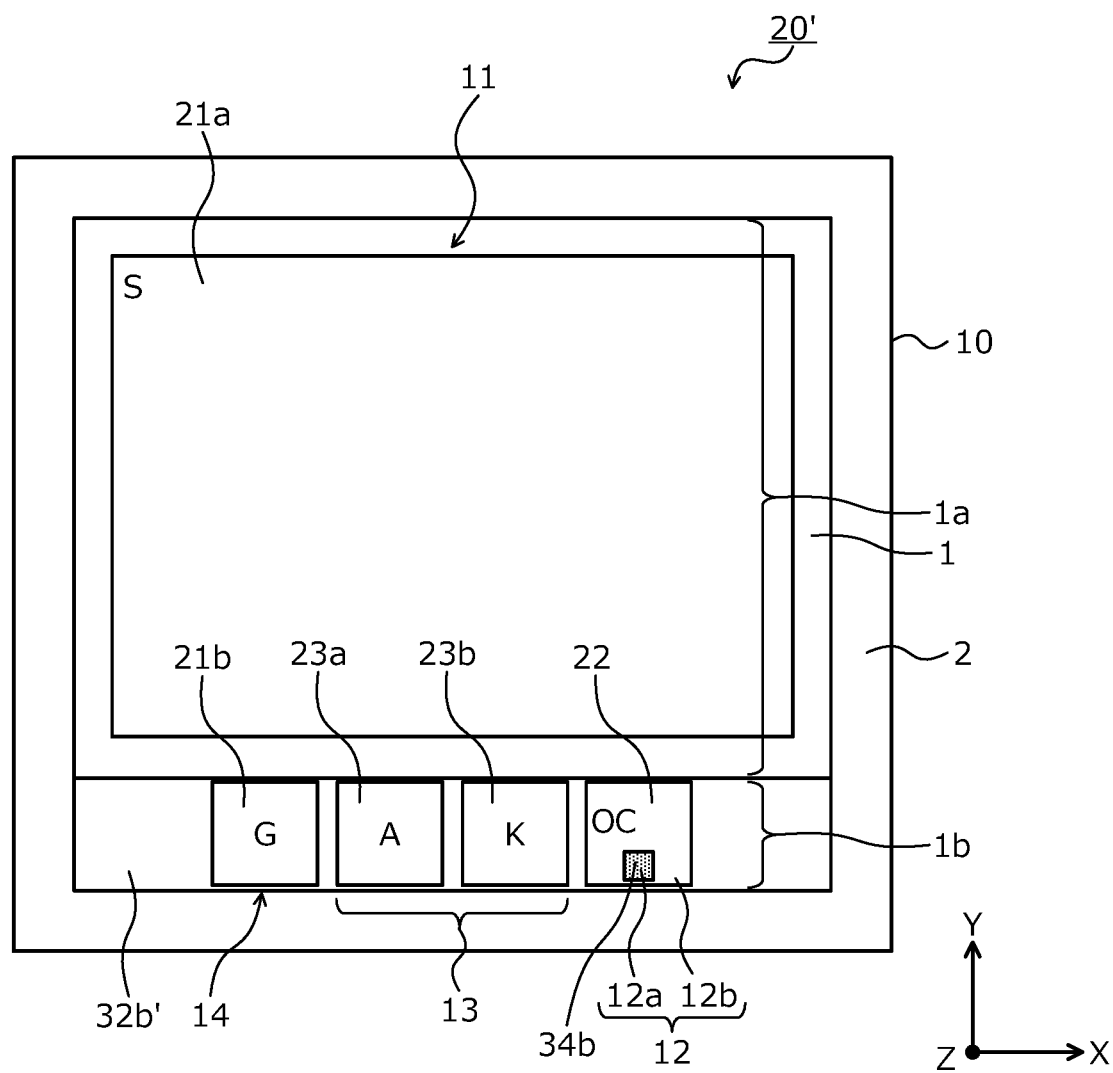
FIG. 13 is a plan view of an example of a layout when the semiconductor device according to the second embodiment is viewed from the front side of the semiconductor substrate.

A semiconductor device according to a second embodiment will be described. FIGS. 11, 12, and 13 are plan views of an example of a layout when the semiconductor device according to the second embodiment is viewed from the front side of the semiconductor substrate. In a semiconductor device 20' according to the second embodiment, a range in which a p-type base region 34c' and an n$^-$-type region 32b' are disposed in the main non-operating region 1b differs from that of the semiconductor device 20 according to the first embodiment (refer to FIGS. 1 to 3).

Therefore, while not depicted, in the second embodiment, in the field insulating film that is provided on the front surface of the semiconductor substrate 10 overall in a region of the main non-operating region 1b excluding the sensing effective region 12a, arrangement of the field insulating film part 80c that is thick, has the thickness t2 and covers the p-type base region 34c' and arrangement of the field insulating film part 80*b* that is thin, has the thickness t3 and covers the n⁻-type region 32*b*' differs from that in the first embodiment.

In particular, as depicted in FIG. 11, the p-type base region 34*c*' may be provided in a surface region of the front surface of the semiconductor substrate 10, in substantially an entire region of the main non-operating region 1*b* excluding that directly beneath the anode pad 23*a* and the OC pad 22. In this case, the n⁻-type region 32*b*' is provided in a surface region of the front surface of the semiconductor substrate 10, in substantially an entire region of the main non-operating region 1*b* directly beneath, the anode pad 23*a* and the OC pad 22.

Further, as depicted in FIG. 12, the p-type base region 34*c*' may be provided in a surface region of the front surface of the semiconductor substrate 10, in substantially an entire region of the main non-operating region 1*b* excluding directly beneath the OC pad 22, the anode pad 23*a*, and the cathode pad 23*b*. In this case, the n⁻-type region 32*b*' is provided in a surface region of the front surface of the semiconductor substrate 10, in substantially an entire region of the main non-operating region 1*b* excluding directly beneath the OC pad 22, the anode pad 23*a*, and the cathode pad 23*b*.

Further, as depicted in FIG. 13, the p-type base region 34*c*' is not provided and the n⁻-type region 32*b*' may be provided in a surface region of the front surface of the semiconductor substrate 10, in substantially an entire region of the main non-operating region 1*b* excluding directly beneath the sensing effective region 12*a*. In this case, of the main non-operating region 1*b* and the edge termination region 2, the p-type region for element isolation is provided in a surface region of the front surface of the semiconductor substrate 10 in only the edge termination region 2.

While not depicted, the n⁻-type region 32*b*' may be provided in a surface region of the front surface of the semiconductor substrate 10, in substantially an entire region of the main non-operating region 1*b* directly beneath all of the electrode pads (the gate pad 21*b*, the OC pad 22, the anode pad 23*a*, and the cathode pad 23*b*). In this case, the p-type base region 34*c*' is provided in a surface region of the front surface of the semiconductor substrate 10, in substantially an entire region of the main non-operating region 1*b* excluding directly beneath the electrode pads.

A ratio of the surface area of the p-type base region 34*c*' and the surface area of the n⁻-type region 32*b*' in the main non-operating region 1*b* is determined by a tradeoff relationship between the forward voltage and the reverse recovery capability of the parasitic diode 17 (refer to FIG. 4) formed in the main non-operating region 1*b*. As the surface area of the p-type base region 34*c*' increases, the forward voltage of the parasitic diode 17 formed in the main non-operating region 1*b* may be increased. As the surface area of the n⁻-type region 32*b* increases, the reverse recovery capability of the parasitic diode 17 formed in the main non-operating region 1*b* may be increased.

As described above, according to the second embodiment, effects similar to those of the first embodiment may be obtained. Further, according to the second embodiment, in the main non-operating region, the surface area ratio between the p-type base region and the n⁻-type region selectively formed in surface regions of the front surface of the semiconductor substrate is variously changed, thereby enabling the tradeoff relationship between the forward voltage and the reverse recovery capability of the parasitic diode formed in the main non-operating region to be within a permissible range.

Figure 14:
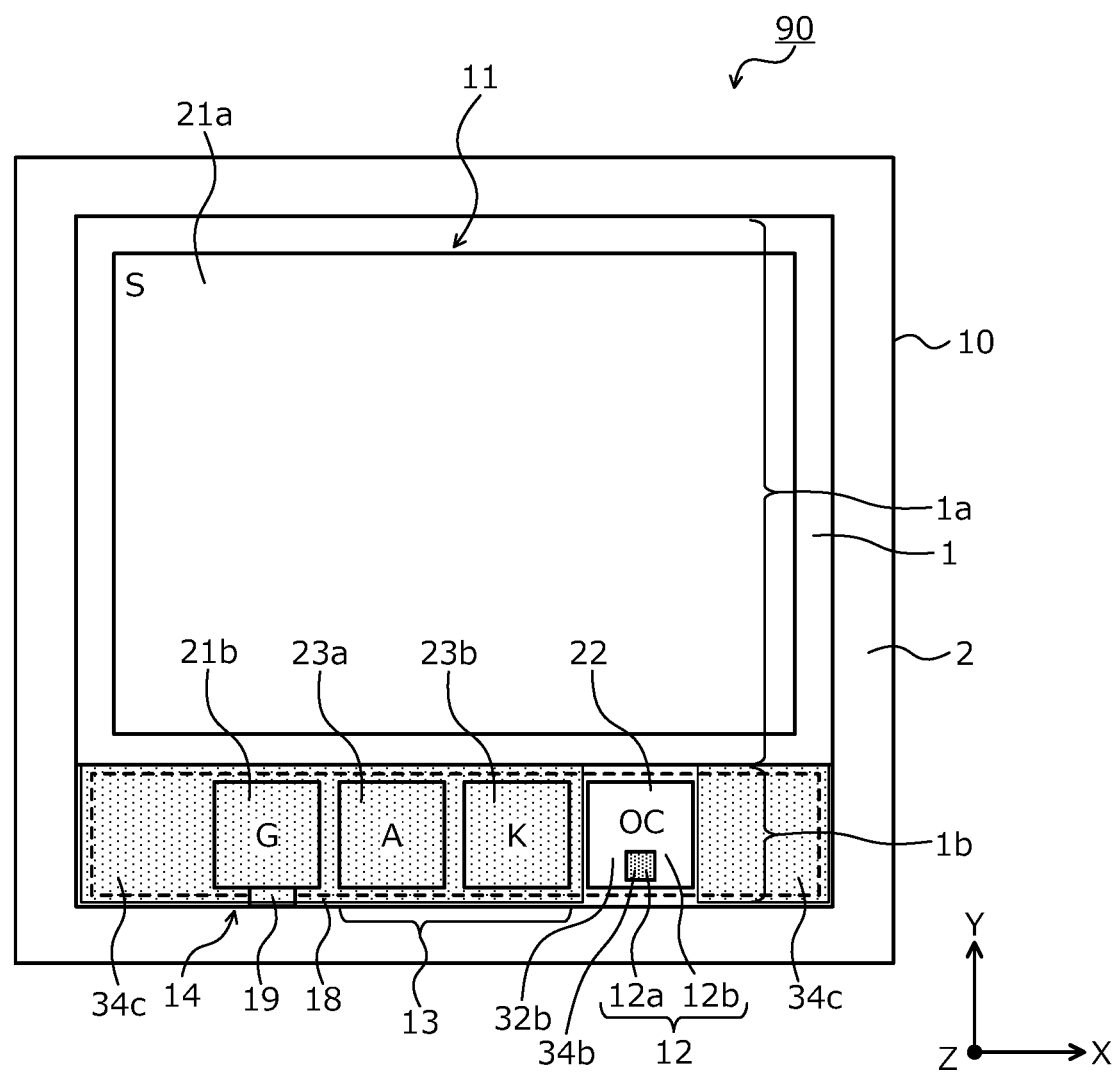
FIG. 14 is a plan view of a layout when a semiconductor device according to a third embodiment is viewed from the front side of the semiconductor substrate.

A semiconductor device according to a third embodiment will be described. FIG. 14 is a plan view of a layout when the semiconductor device according to the third embodiment is viewed from the front side of the semiconductor substrate. A semiconductor device 90 according to the third embodiment differs from the semiconductor device 20 according to the first embodiment (refer to FIGS. 1 to 3) in that a metal electrode (hereinafter, lead-out electrode) 18 is further included that leads out hole current generated in the n⁻-type drift region 32 near the main non-operating region 1*b* to the grounding point GND of the ground potential.

The lead-out electrode 18, in the main non-operating region 1*b*, is provided on the front surface of the semiconductor substrate 10 and is electrically connected to the p-type base region 34*c*. The lead-out electrode 18 is fixed at the electric potential (source potential: the ground potential) of the source pad 21*a*. The lead-out electrode 18, for example, is provided in an outer periphery of the main non-operating region 1*b* excluding a portion in which a connecting region 19 of the gate pad 21*b* and a gate metal electrode (not depicted) are disposed. The gate metal electrode is provided on the gate runner and is a metal layer electrically connected to the gate runner.

The lead-out electrode 18 has a function of leading hole current out to the grounding point GND of the ground potential, via the p-type base region 34*c*, when the parasitic diodes 16, 17 (refer to FIG. 4) of the active region 1 turn OFF, that is, the hole current that is generated in the n⁻-type drift region 32 of the edge termination region 2 and the main effective region 1*a* and that flows into the main non-operating region 1*b*. In FIG. 14, an inner periphery of the lead-out electrode 18 is indicated by a dashed line. A periphery of the lead-out electrode 18 is the same as a periphery of the main non-operating region 1*b*.

As described above, according to the third embodiment, effects similar to those of the first embodiment may be obtained. Further, according to the third embodiment, in the main non-operating region, the lead-out electrode that is electrically connected to the p-type base region that is fixed at the source potential is provided, whereby when the parasitic diode of the active region turns OFF, hole current that flows into the main non-operating region may be lead out by the lead-out electrode and therefore, the reverse recovery capability of the parasitic diode in the main non-operating region may be further enhanced.

Figure 15:
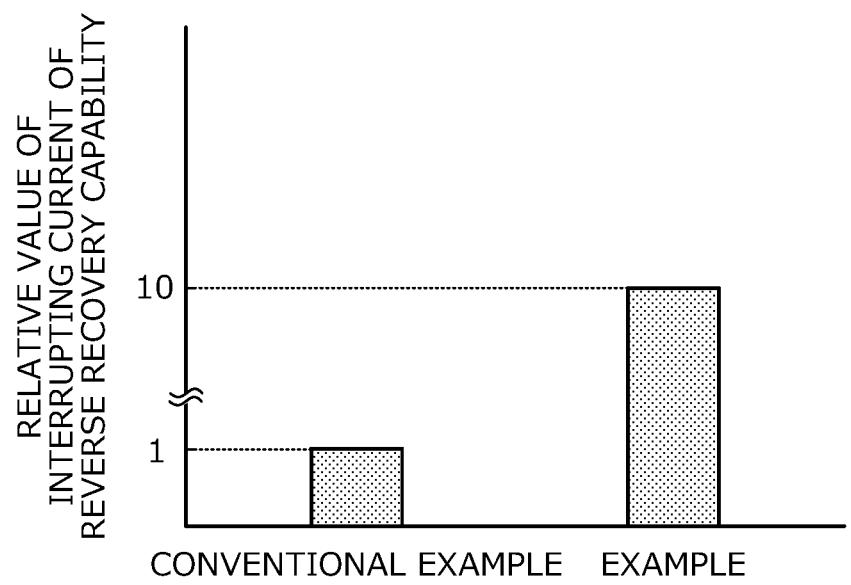
FIG. 15 is a characteristics diagram of amounts of interrupting current due to reverse recovery capability of an example.

The reverse recovery capability of the semiconductor device 20 according to the first embodiment was examined. FIG. 15 is a characteristics diagram of amounts of interrupting current due to reverse recovery capability of an example. Results of comparison of the amount of hole current (interrupting current) that passes through the p-type base region of the main effective region and that is lead out to the source pad during turn OFF of the parasitic diode of the active region in the semiconductor device 20 according to the first embodiment described above (hereinafter, the example, refer to FIG. 1) and in the conventional semiconductor device 120 (hereinafter, comparison example, refer to FIG. 16) are depicted in FIG. 15.

As depicted in FIG. 15, in the example, it was confirmed that during turn OFF of the parasitic diodes 16, 17 (refer to FIG. 4) of the active region 1, the amount of hole current passing through the p-type base region 34*a* of the main effective region 1*a* and lead out to the source pad 21*a* is greater as compared to that in the conventional example. In the example, the n⁻-type region 32*b* is disposed in the main non-operating region 1*b* so as to surround a periphery of the sensing effective region 12*a*, whereby the hole current generated near the main non-operating region 1b does not easily flow into the sensing effective region 12a and the reverse recovery capability of the parasitic diode 17 of the main non-operating region 1b is enhanced.

While not depicted, in the semiconductor devices 20', 90 according to the second and the third embodiments as well, it was confirmed by the inventor that effects similar to those of the example are obtained.

In the foregoing, the present invention is not limited to the embodiments described above and various modifications within a range not departing from the spirit of the invention are possible. For example, instead of the trench gate structure, a planar gate structure may be provided. The present invention is further applicable in cases where instead of silicon carbide for the semiconductor material, a wide bandgap material other than silicon carbide is used as a semiconductor material. Further, the present invention is similarly implemented when the conductivity types (n-type, p-type) are reversed.

The semiconductor device according to the present invention achieves an effect in that in a semiconductor device including a current sensing portion on a single semiconductor substrate having a main semiconductor element, the reverse recovery capability of a parasitic diode may be enhanced.

As described above, the semiconductor device according to the present invention is useful for semiconductor devices that include a current sensing portion on a single semiconductor substrate having a main semiconductor element and is particularly suitable for semiconductor devices needing a surface area of a main non-operating region that does not function as the main semiconductor element to be set largely.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a semiconductor substrate containing a semiconductor having a bandgap wider than that of silicon, and having a first main surface and a second main surface opposite to the first main surface, the semiconductor substrate having first and second effective regions and a non-operating region that excludes the first and second effective regions;
    a first first-conductivity-type region of a first conductivity type, provided in the semiconductor substrate;
    a first second-conductivity-type region of a second conductivity type, provided between the first main surface of the semiconductor substrate and the first first-conductivity-type region;
    a first insulated gate field effect transistor, provided in the first effective region and having the first first-conductivity-type region as a drift region and the first second-conductivity-type region as a base region, the first insulated gate field effect transistor being constituted by a plurality of unit cells each having a cell structure;
    a first source pad of the first insulated gate field effect transistor, provided on the first main surface of the semiconductor substrate and electrically connected to the first second-conductivity-type region;
    a second second-conductivity-type region of the second conductivity type, provided between the first main surface of the semiconductor substrate and the first first-conductivity-type region, in a region different from the first second-conductivity-type region;
    a second insulated gate field effect transistor, provided in the second effective region, and having the first first-conductivity-type region as a drift region and the second second-conductivity-type region as a base region, the second insulated gate field effect transistor being constituted by a plurality of unit cells each having a cell structure same as the cell structure of each of the unit cells of the first insulated gate field effect transistor, a quantity of the plurality of unit cells of the second insulated gate field effect transistor being smaller than a quantity of the plurality of unit cells of the first insulated gate field effect transistor;
    a second source pad of the second insulated gate field effect transistor, provided on the first main surface of the semiconductor substrate, being separate from the first source pad and electrically connected to the second second-conductivity-type region;
    a field insulating film including a first part that covers the first main surface of the semiconductor substrate in the non-operating region and a second part that covers the first main surface of the semiconductor substrate in the first and second effective regions;
    a second first-conductivity-type region of the first conductivity type, surrounding a periphery of the second effective region and contacting the second effective region, the second first-conductivity-type region being provided in the non-operating region, between the first main surface of the semiconductor substrate and the first first-conductivity-type region; and
    a drain electrode that is common to the first insulated gate field effect transistor and the second insulated gate field effect transistor, and is electrically connected to the second main surface of the semiconductor substrate, wherein
    the first part of the field insulating film has a thickness greater than a thickness of the second part of the field insulating film.

2. The semiconductor device according to claim 1, wherein
    a surface area of the second first-conductivity-type region is at least equal to a surface area of the second effective region.

3. The semiconductor device according to claim 2, wherein
    the second first-type region is provided in an entire region that is directly beneath the second source pad and excludes the second effective region.

4. The semiconductor device according to claim 3, further comprising
    one or more electrode pads each facing the semiconductor substrate in a direction orthogonal to the first main surface of the semiconductor substrate, being provided on the first main surface of the semiconductor substrate in the non-operating region, and being separate from the first source pad and the second source pad, wherein
    the second first-conductivity-type region extends from directly beneath the second source pad, to a region that faces at least one of the one or more electrode pads in the direction orthogonal to the first main surface of the semiconductor substrate.

5. The semiconductor device according to claim 4, wherein
    the one or more electrode pads includes a gate pad of the first insulated gate field effect transistor.

6. The semiconductor device according to claim 4, further comprising
a diode that detects a temperature of the first insulated gate field effect transistor, wherein
the one or more electrode pads includes an electrode pad of the diode.

7. The semiconductor device according to claim 4, further comprising
a diode that protects the first insulated gate field effect transistor from overvoltage, wherein
the one or more electrode pads includes an electrode pad of the diode.

8. The semiconductor device according to claim 4, wherein
the second first-conductivity-type region is provided in an entire area of the non-operating region.

9. The semiconductor device according to claim 1, further comprising
a third second-conductivity-type region of the second conductivity type, provided in a region within the non-operating region excluding a region in which the second first-conductivity-type region is provided, the third second-conductivity-type region being provided between the first main surface of the semiconductor substrate and the first first-conductivity-type region, being electrically connected to the first second-conductivity-type region, and facing the second effective region in a direction parallel to the first main surface of the semiconductor substrate, via the second first-conductivity-type region.

10. The semiconductor device according to claim 1, wherein
the thickness of the first part of the field insulating film is 1.5 times to 2.5 times the thickness of the second part of the field insulating film.

11. The semiconductor device according to claim 1, wherein
the second insulated gate field effect transistor detects overcurrent of the first insulated gate field effect transistor.

* * * * *